(12) United States Patent
Lin et al.

(10) Patent No.: US 12,520,521 B2
(45) Date of Patent: Jan. 6, 2026

(54) METHOD OF FORMING HIGH VOLTAGE TRANSISTOR AND STRUCTURE RESULTING THEREFROM

(71) Applicant: TAIWAN SEMICONDUCTOR MANUFACTURING COMPANY LTD., Hsinchu (TW)

(72) Inventors: Ling Mei Lin, Tainan (TW); Yu-Chang Jong, Hsinchu (TW); Chih-Hsiung Huang, Hsinchu County (TW); Yu-Hsien Chu, Kaohsiung (TW); Wen-Chih Chiang, Hsinchu (TW); Chih-Ming Lee, Tainan (TW); Cheng-Ming Wu, Tainan (TW); Pei-Lun Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 434 days.

(21) Appl. No.: 18/150,206

(22) Filed: Jan. 5, 2023

(65) Prior Publication Data

US 2024/0234566 A1   Jul. 11, 2024

(51) Int. Cl.
| | |
|---|---|
| *H10D 30/64* | (2025.01) |
| *H01L 21/02* | (2006.01) |
| *H01L 21/033* | (2006.01) |
| *H01L 21/311* | (2006.01) |
| *H10D 30/01* | (2025.01) |
| *H10D 62/10* | (2025.01) |
| *H10D 62/13* | (2025.01) |

(Continued)

(52) U.S. Cl.
CPC ........ *H10D 30/64* (2025.01); *H01L 21/0206* (2013.01); *H01L 21/02164* (2013.01); *H01L 21/0217* (2013.01); *H01L 21/02255* (2013.01); *H01L 21/02263* (2013.01); *H01L 21/02304* (2013.01); *H01L 21/0332* (2013.01); *H01L 21/0335* (2013.01); *H01L 21/0337* (2013.01); *H01L 21/31105* (2013.01); *H01L 21/31144* (2013.01); *H10D 30/028* (2025.01); *H10D 62/103* (2025.01); *H10D 62/152* (2025.01); *H10D 64/01* (2025.01); *H10D 64/514* (2025.01)

(58) Field of Classification Search
None
See application file for complete search history.

(56) References Cited

U.S. PATENT DOCUMENTS

| | | | |
|---|---|---|---|
| 2010/0283101 A1* | 11/2010 | Chen | H10B 41/48 257/E21.24 |
| 2013/0181287 A1* | 7/2013 | Zhang | H10D 64/516 257/E29.256 |

(Continued)

*Primary Examiner* — Khaja Ahmad
(74) *Attorney, Agent, or Firm* — WPAT LAW; Anthony King

(57) ABSTRACT

A method includes: forming a barrier layer in a substrate; depositing a first dielectric layer over the substrate; forming a patterned mask layer over the first dielectric layer; patterning the first dielectric layer into a first sublayer of a gate dielectric layer; converting at least part of the patterned mask layer into a second sublayer of the gate dielectric layer; depositing a second dielectric layer adjacent to the first and second sublayers to serve as a third sublayer of the gate dielectric layer; and depositing a gate electrode over the gate dielectric layer.

20 Claims, 28 Drawing Sheets

(51) Int. Cl.
 *H10D 64/01* (2025.01)
 *H10D 64/27* (2025.01)

(56) References Cited

U.S. PATENT DOCUMENTS

2015/0061011 A1* 3/2015 Cheng .................. H10D 30/603
 257/344
2016/0190269 A1* 6/2016 Brown ............... H10D 30/0221
 438/286

* cited by examiner

METHOD OF FORMING HIGH VOLTAGE TRANSISTOR AND STRUCTURE RESULTING THEREFROM

BACKGROUND

High-voltage transistors are widely used in modern semiconductor devices, e.g., power management integrated circuits (PMIC). The high-voltage transistors are generally designed to be operated at a greater voltage, e.g., voltage greater than 10 volts, 20 volts or 30 volts. Therefore, a high breakdown voltage is required for a high-voltage transistor, which may be required to operate normally for an acceptable working period, e.g., at least eight or ten years. As such, there is a need to improve the manufacturing process of the high-voltage transistor to enhance the breakdown voltage and extend the lifetime of the high-voltage transistor under the high voltage working scenarios.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
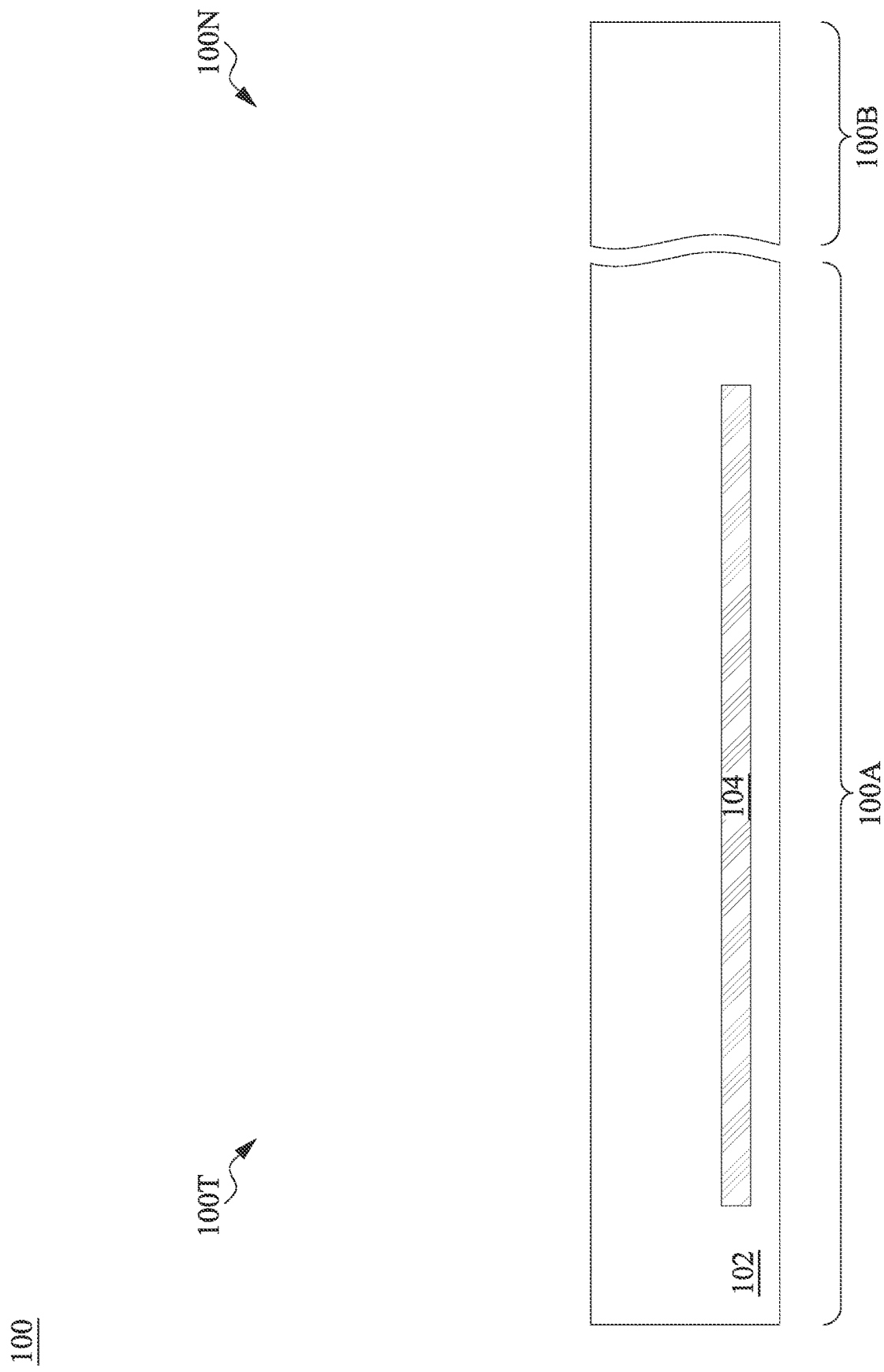
FIGS. 1A to 1T are cross-sectional views of intermediate stages of a method of forming a semiconductor device, in accordance with some embodiments of the present disclosure.

The following disclosure provides many different embodiments, or examples, for implementing different features of the provided subject matter. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Embodiments of the present disclosure discuss a method of forming high-voltage (HV) transistors and a semiconductor structure resulting therefrom. The HV transistors are generally operated under a relatively high voltage, e.g., about 30 volts or higher. Among the various HV transistor configurations, the BCD (bipolar CMOS DMOS) transistors or the laterally-diffused MOS (LDMOS) transistors provide the advantages of low turn-on resistance and high breakdown voltage. However, as the voltage operation range is continually increased for the HV transistors in modern applications, the breakdown voltage of the HV transistor should also be increased accordingly for withstanding the high operation voltage. In order to maintain a low turn-on resistance and good withstanding performance to high voltages, a thick gate dielectric layer is used in the HV transistor. A nitrogen-containing mask layer may be used as an anti-reflective coating (ARC) or a mask layer in patterning the thick gate dielectric layer of the HV transistor. The nitrogen-containing mask layer will be removed using a wet etch method after the gate dielectric layer is formed. The wet etch is generally performed using phosphoric acid or other similar etchants. In some examples, the wet etching operation involved by the phosphoric acid may damage the surface of the BCD device, and thus some surface defects may occur on the surface of the substrate of the HV transistor. As a consequence, the performance of the HV transistor is compromised.

To address the above issues, the present disclosure proposes a forming method of a semiconductor structure including the HV transistor and non-HV (NHV) transistor, where the gate dielectric layer or the HV transistor is formed without removing the nitrogen-containing ARC or mask layer. The nitrogen-containing ARC or mask layer is further converted into part of the gate dielectric layer. As a result, the likelihood of surface defect of the HV transistor can be decreased while the gate dielectric layer of the HV transistor can even be formed with greater thickness. Therefore, the device performance and production yield can be enhanced.

Figure 1B:
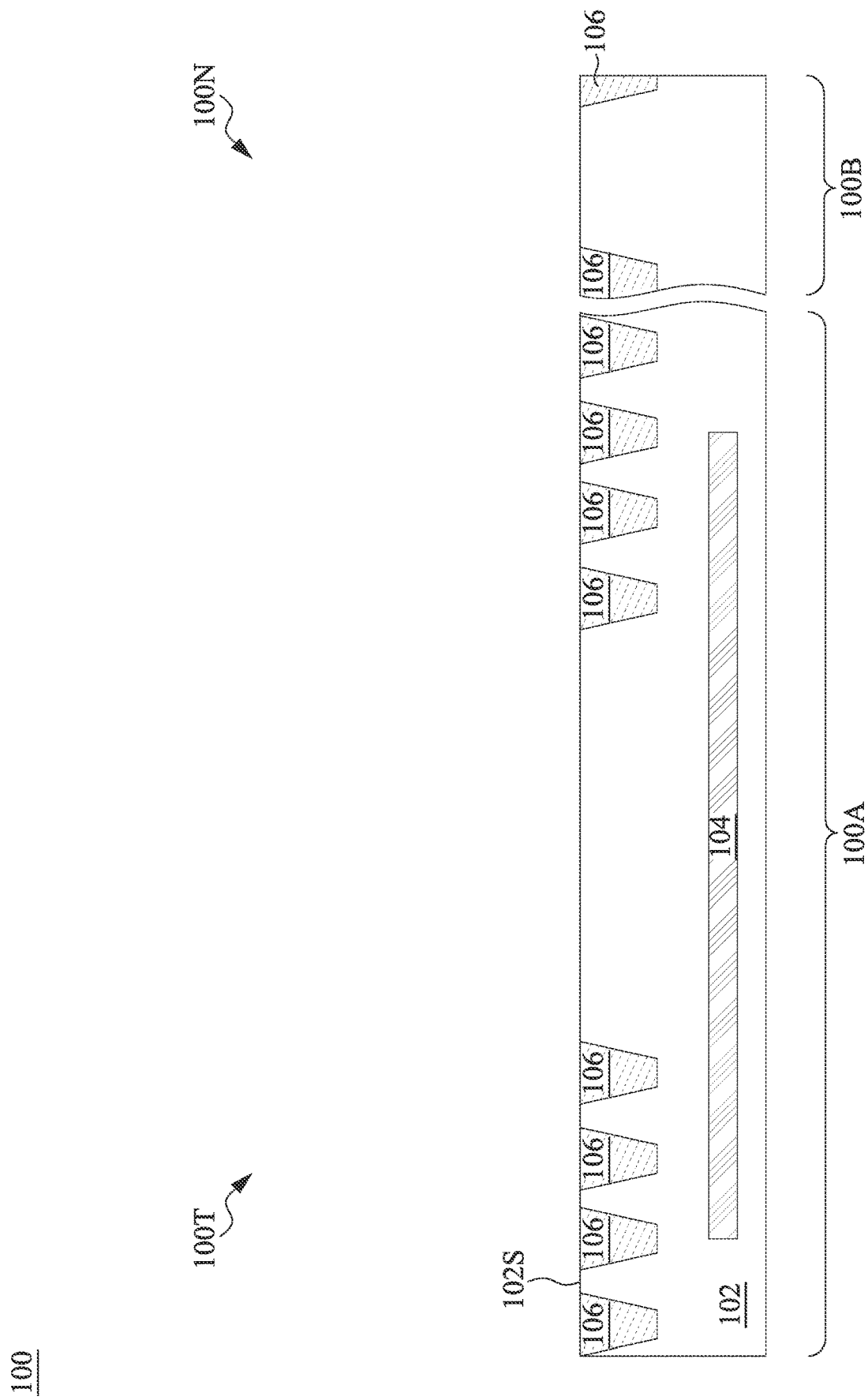
Figure 1C:
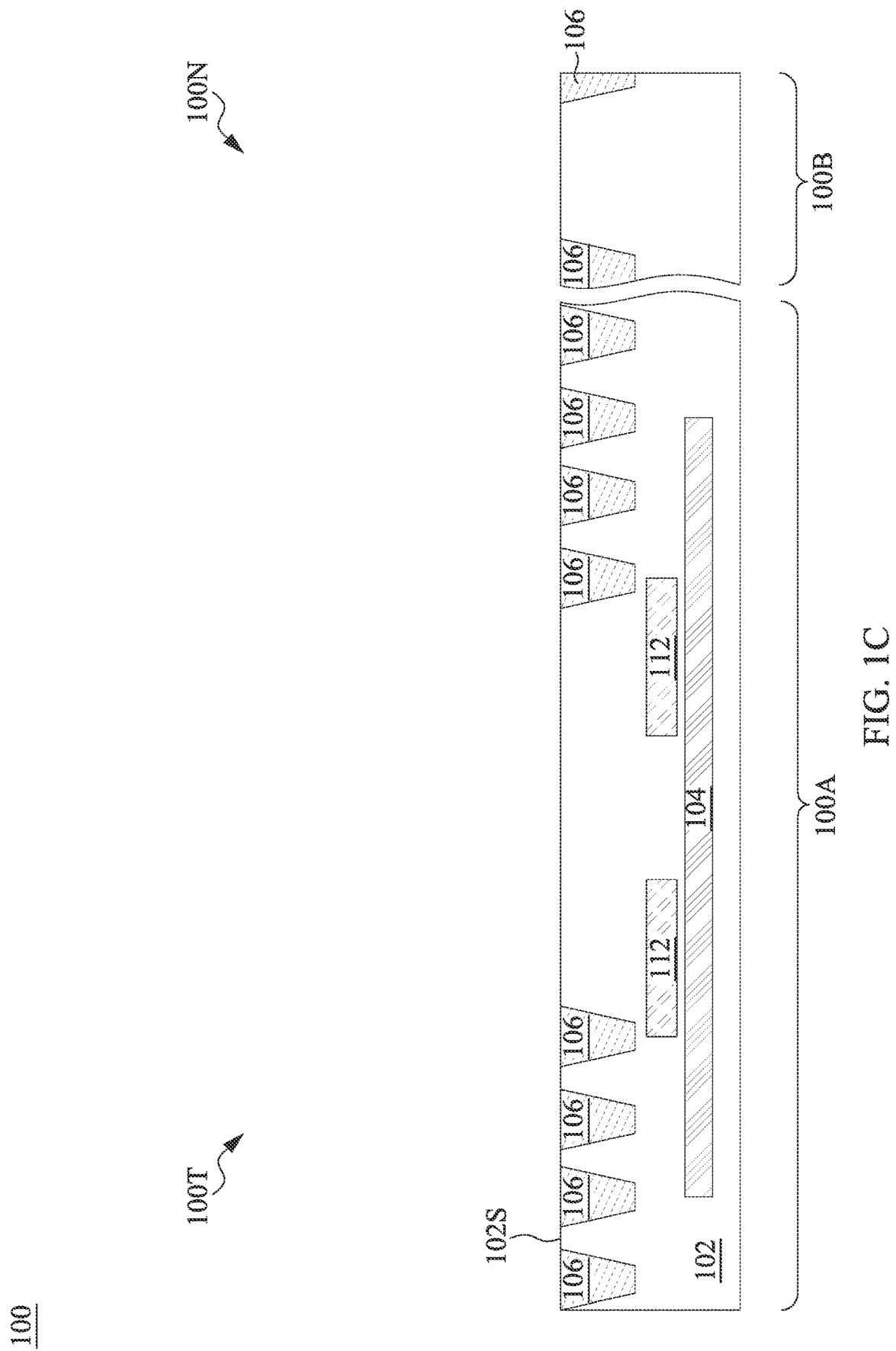
Figure 1D:
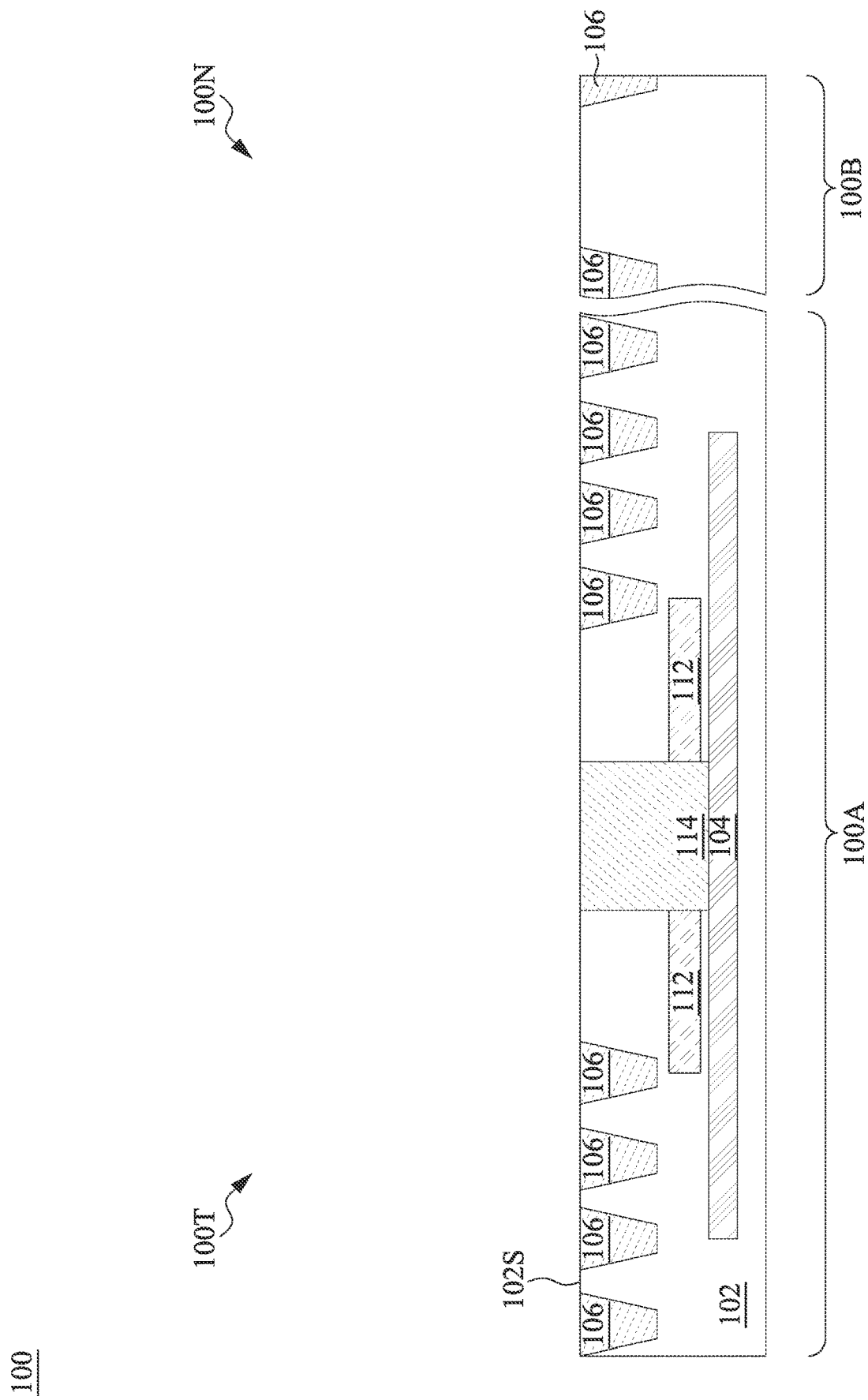
Figure 1E:
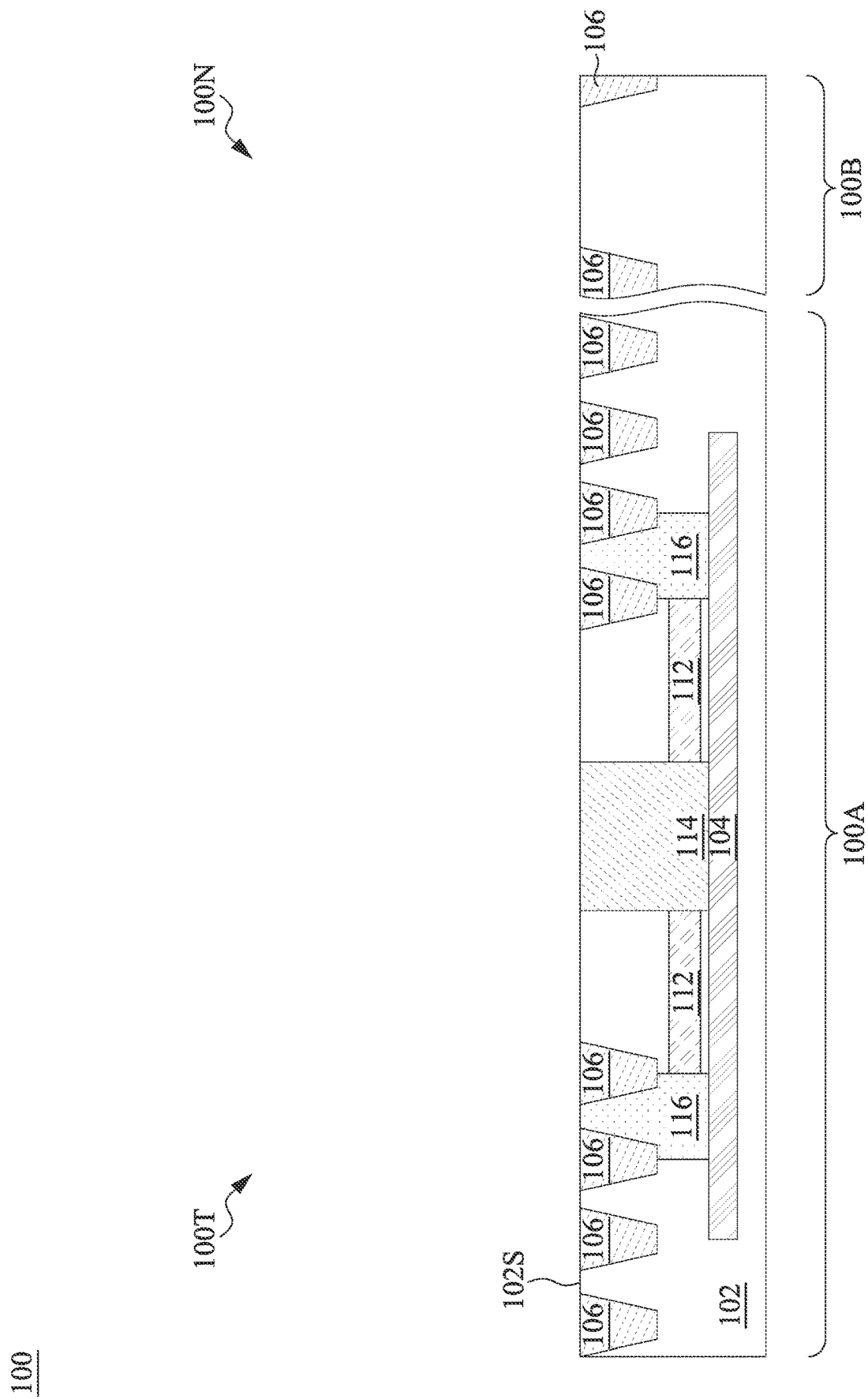
Figure 1F:
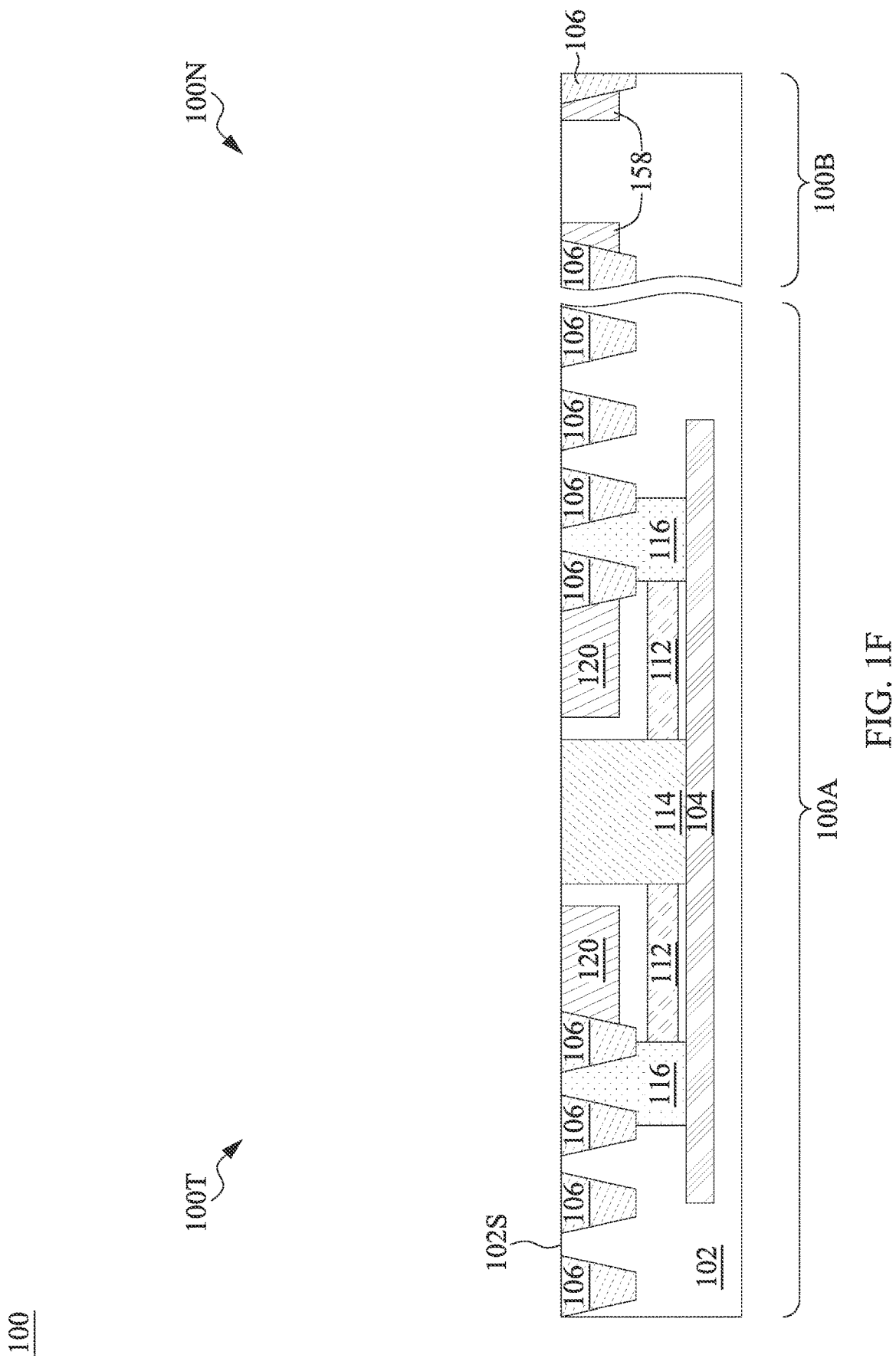
Figure 1G:
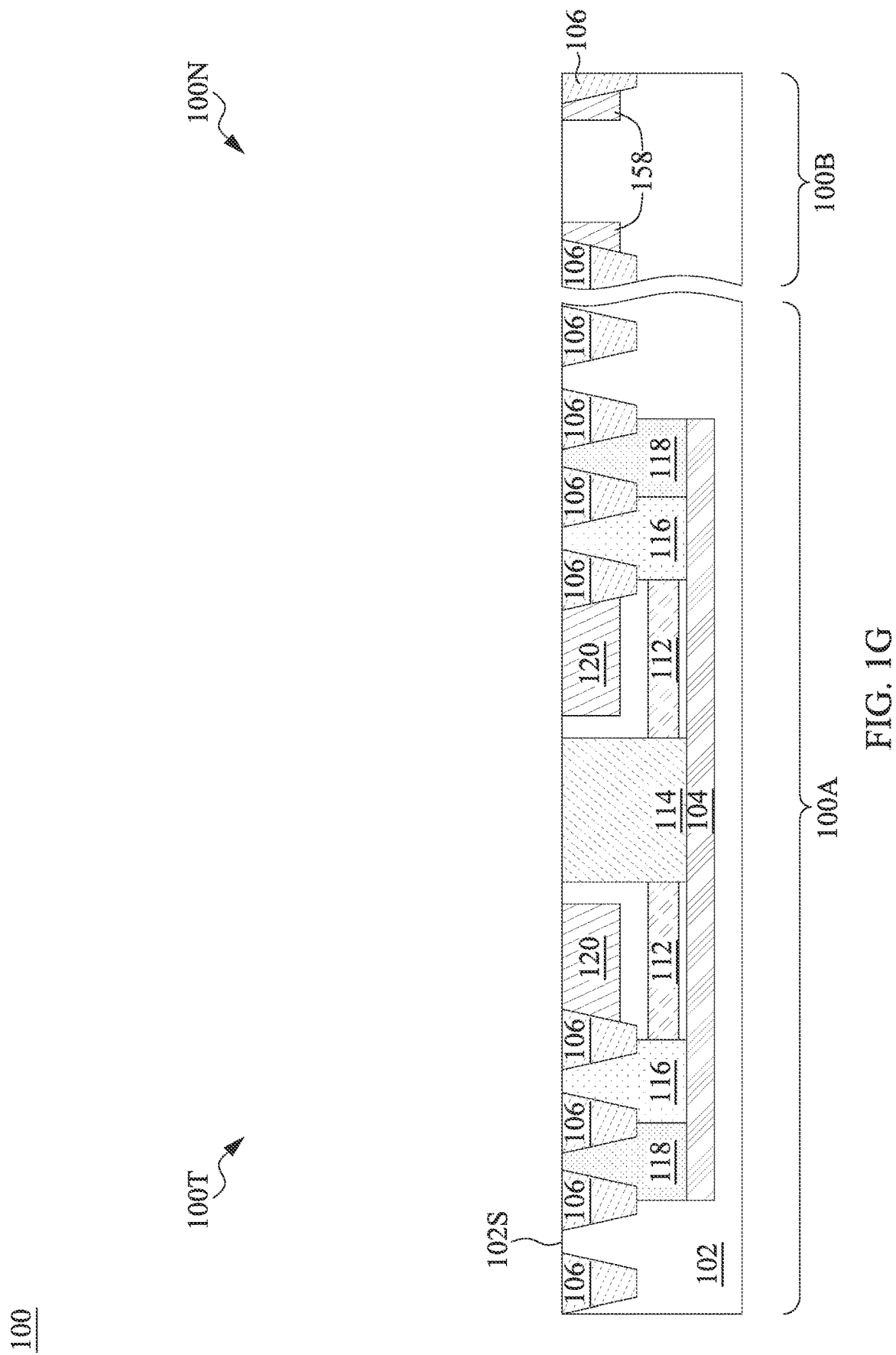
Figure 1H:
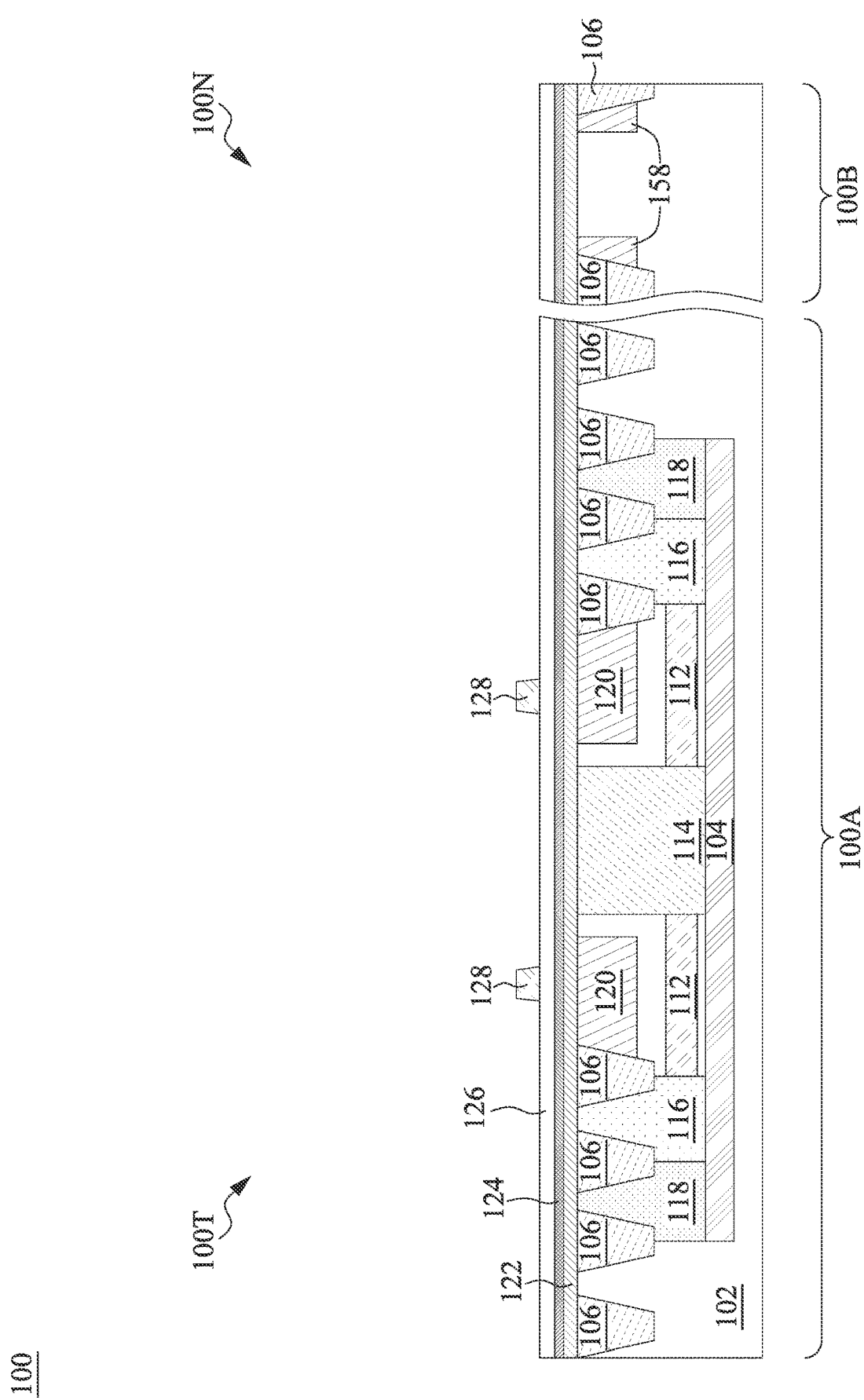
Figure 1I:
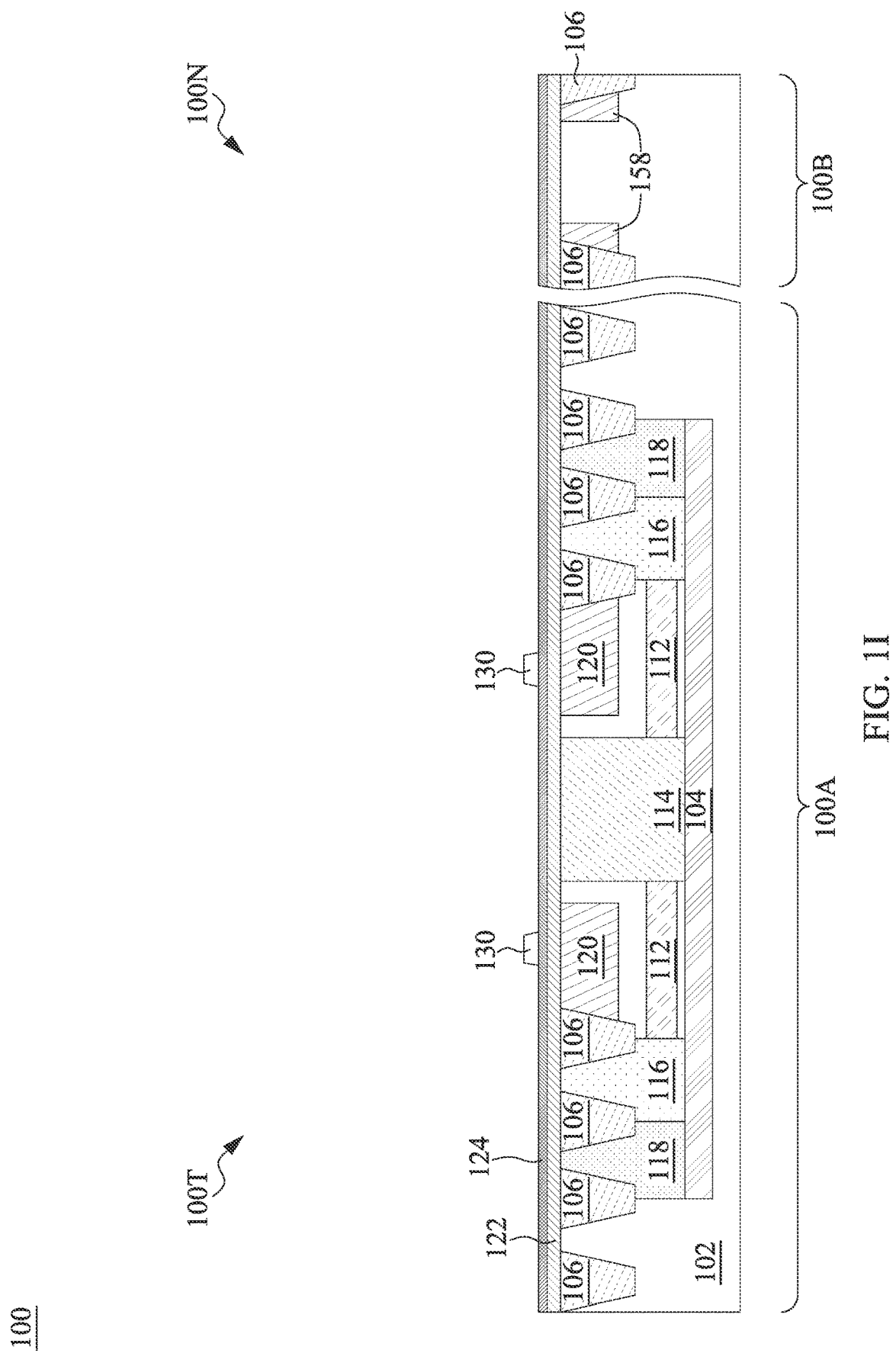
Figure 1J:
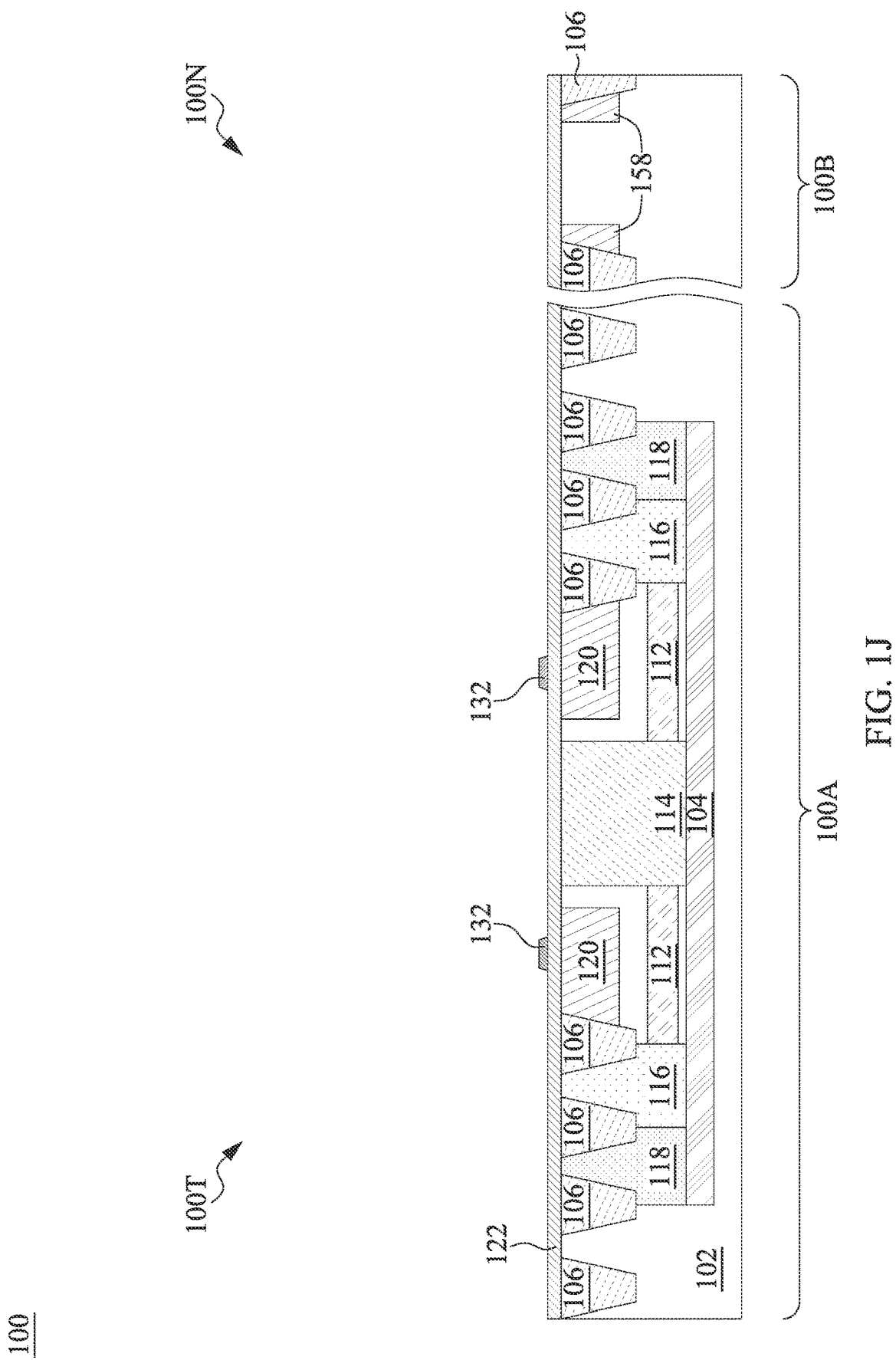
Figure 1K:
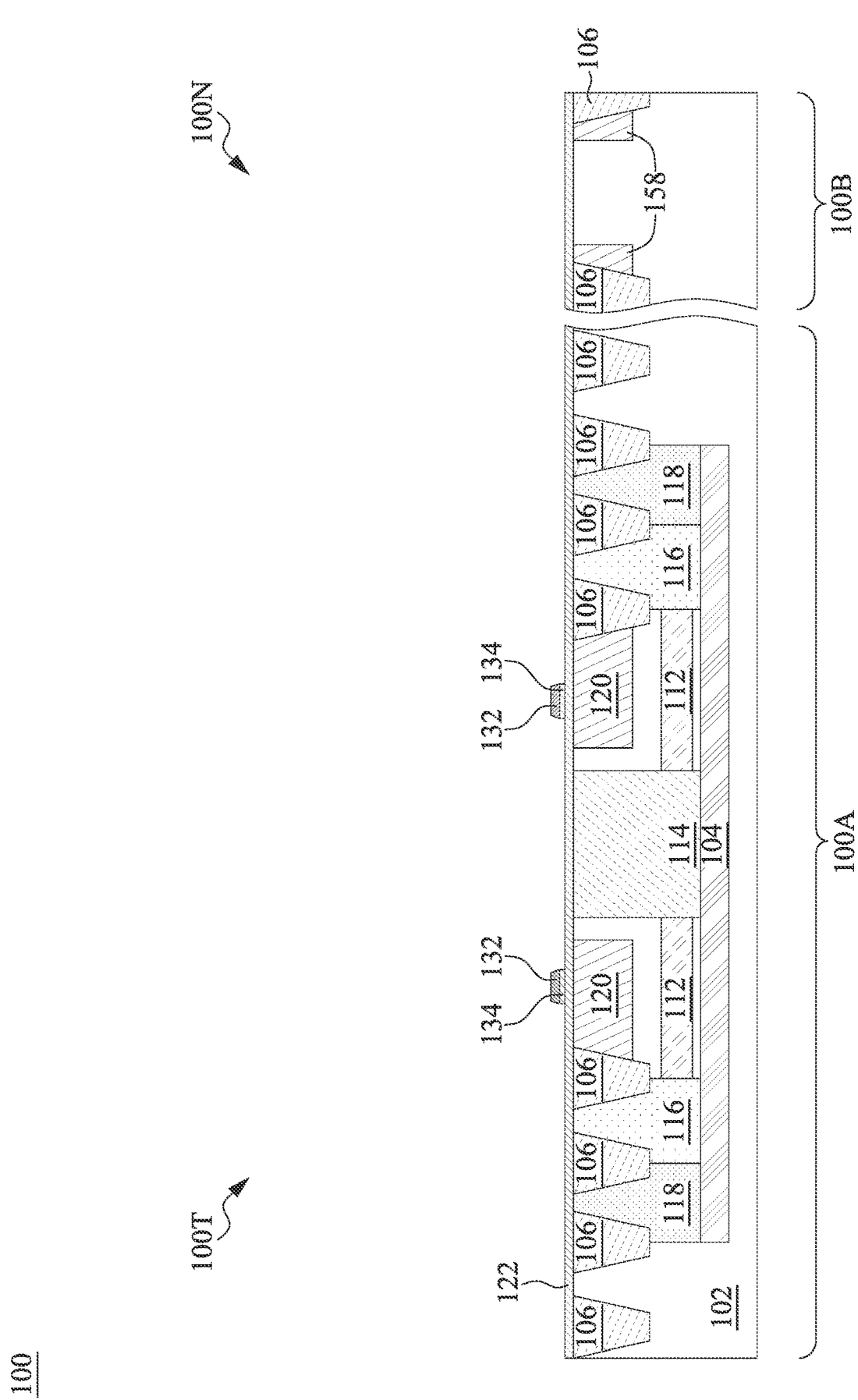
Figure 1L:
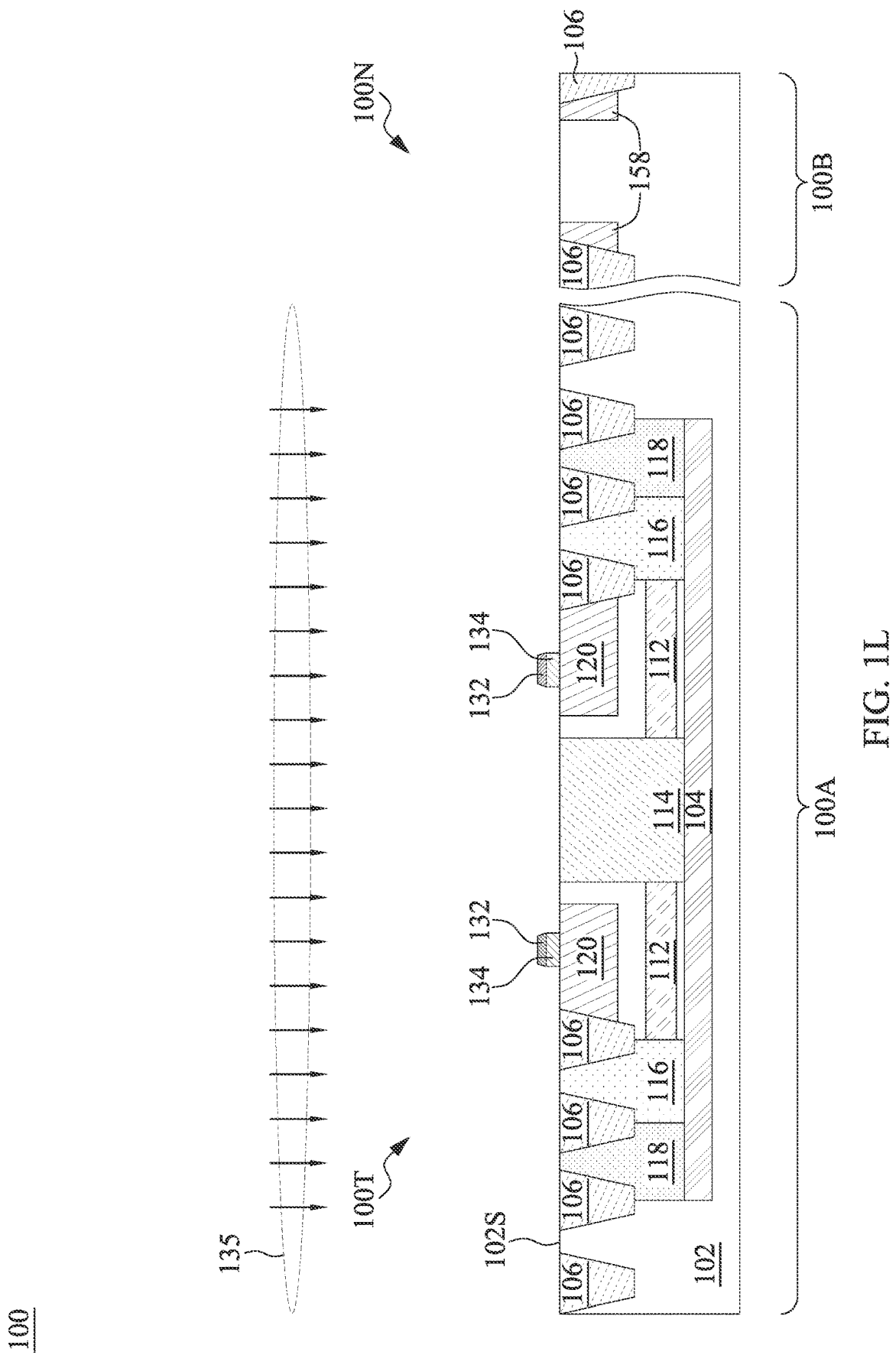
Figure 1M:
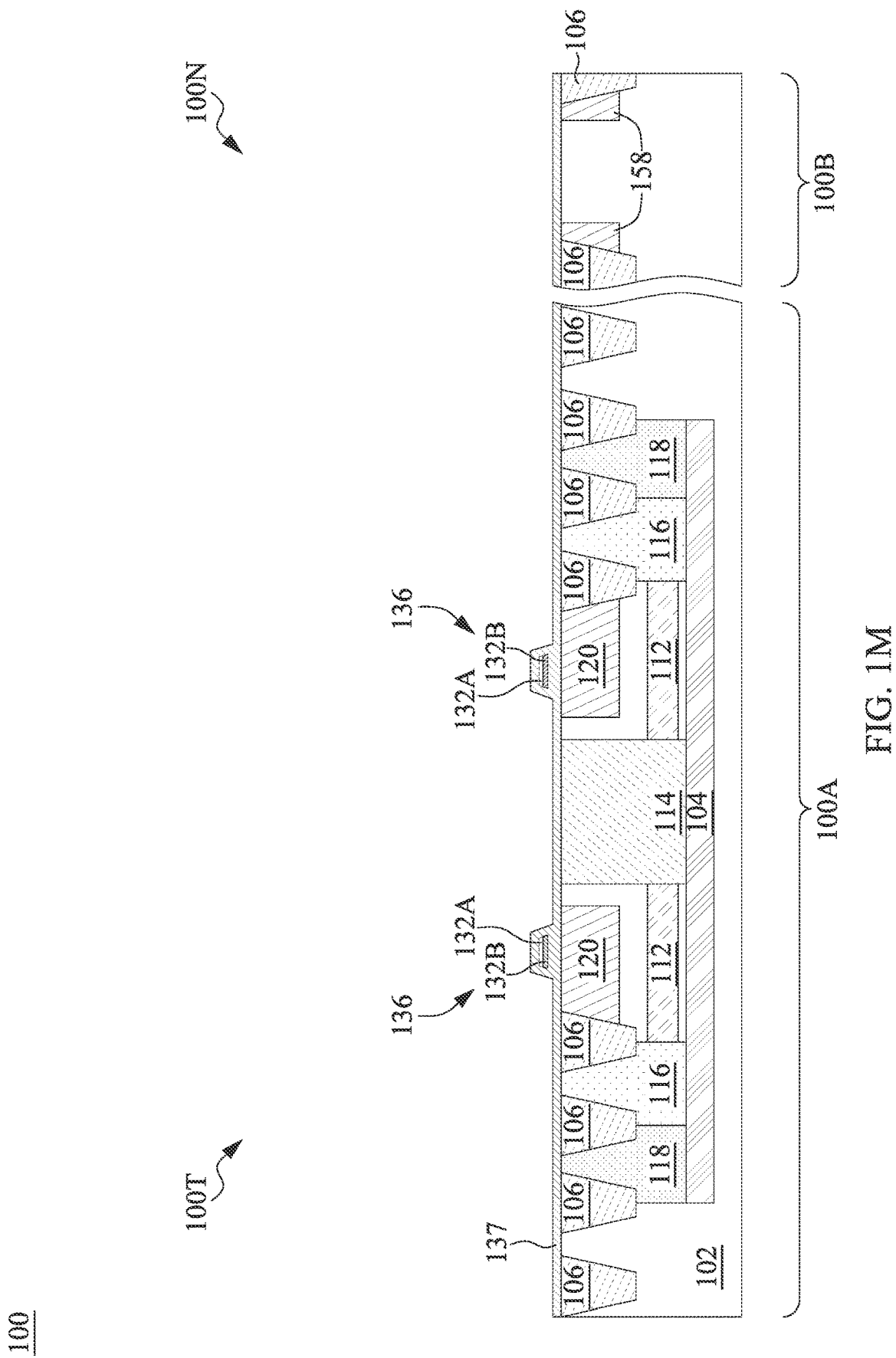
Figure 1N:
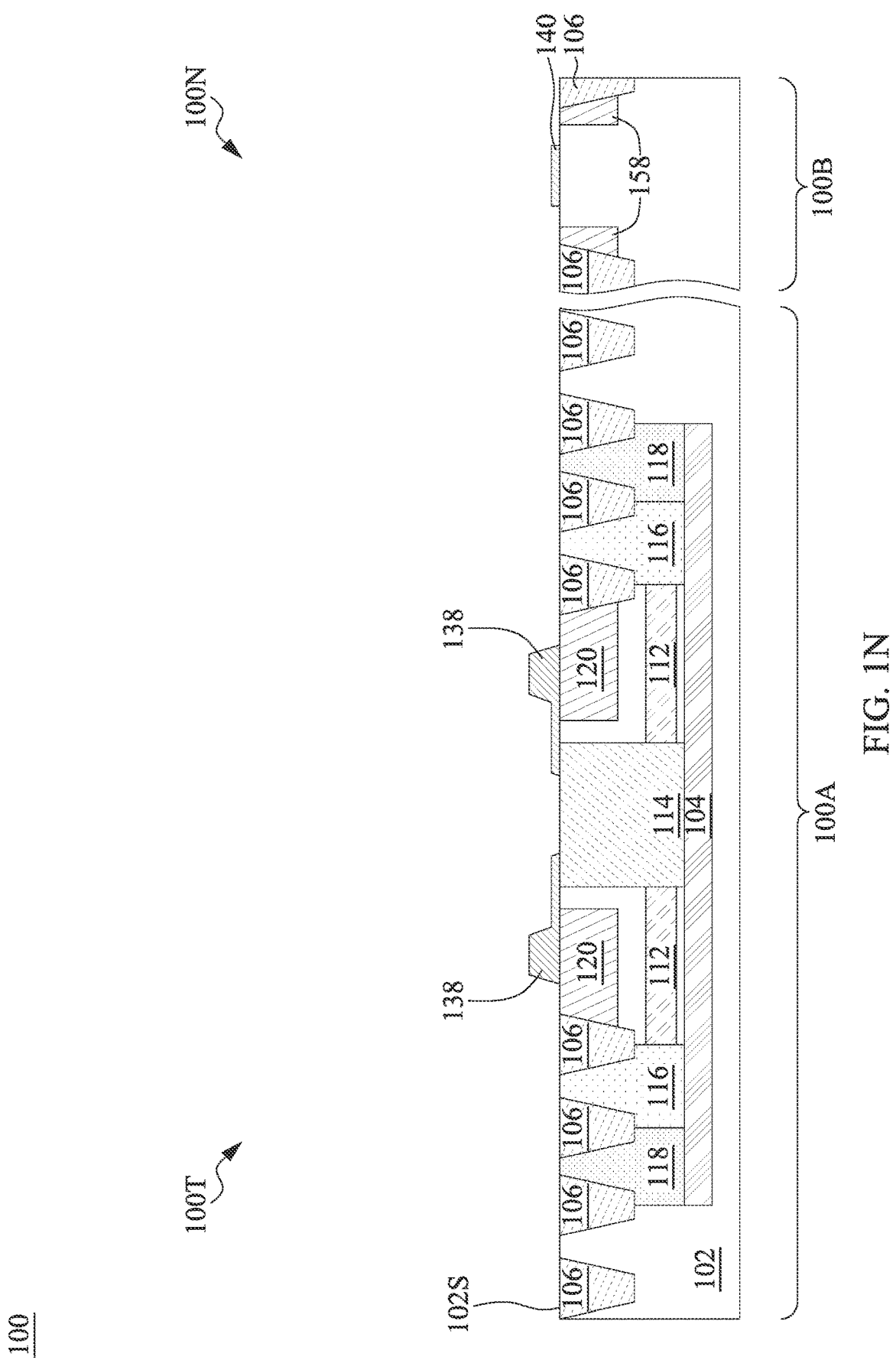
Figure 10:
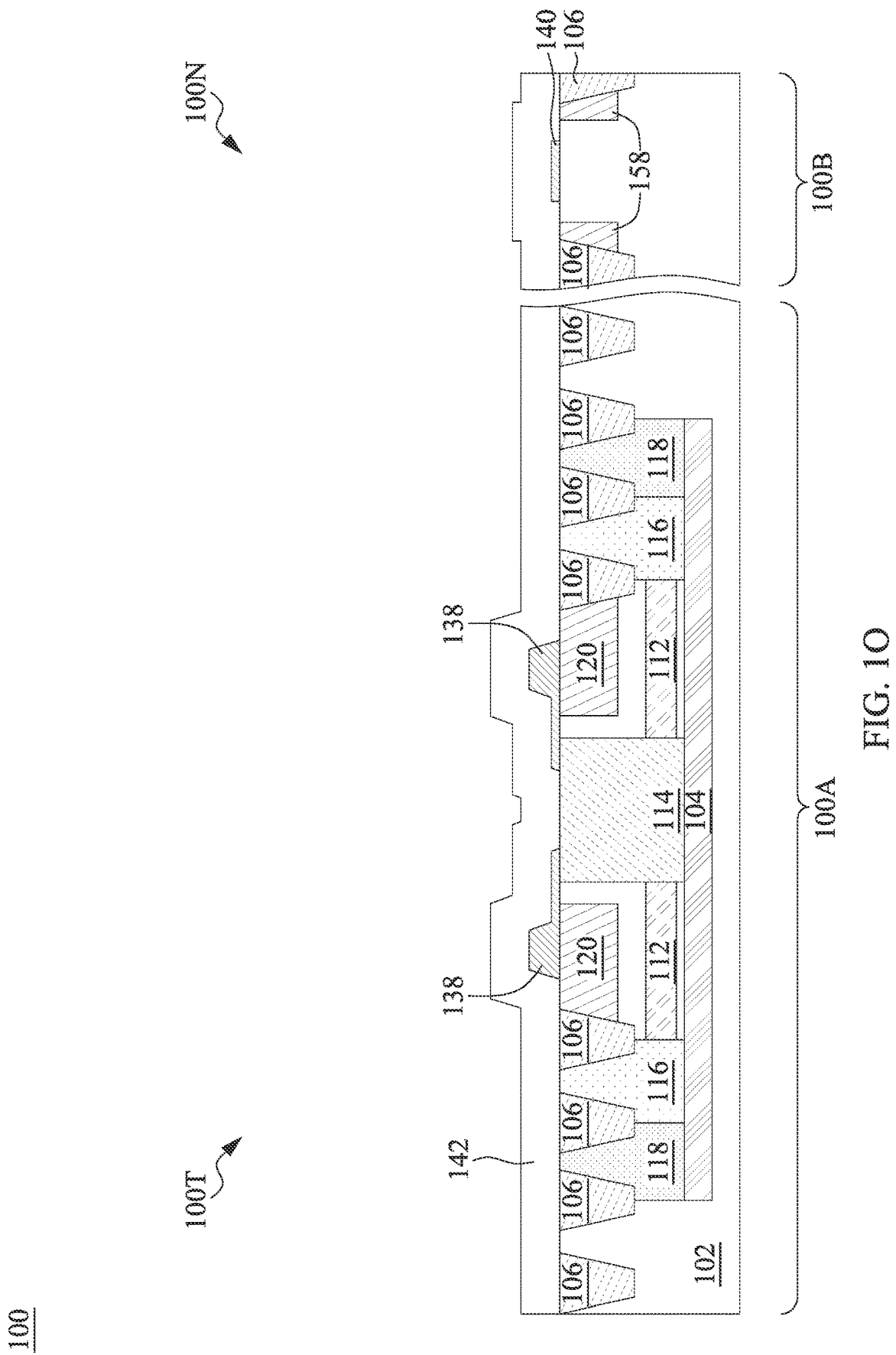
Figure 1P:
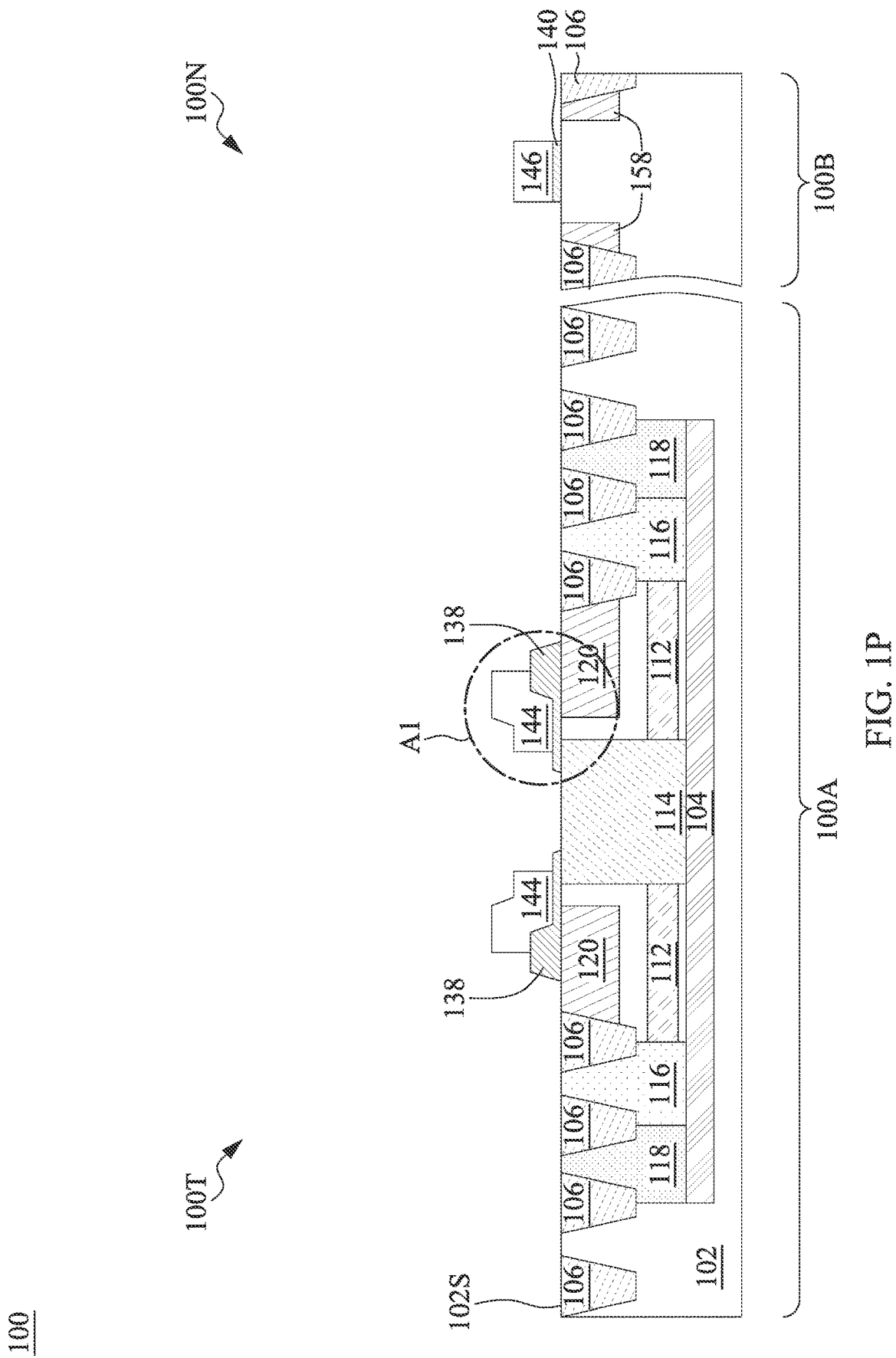
Figure 1Q:
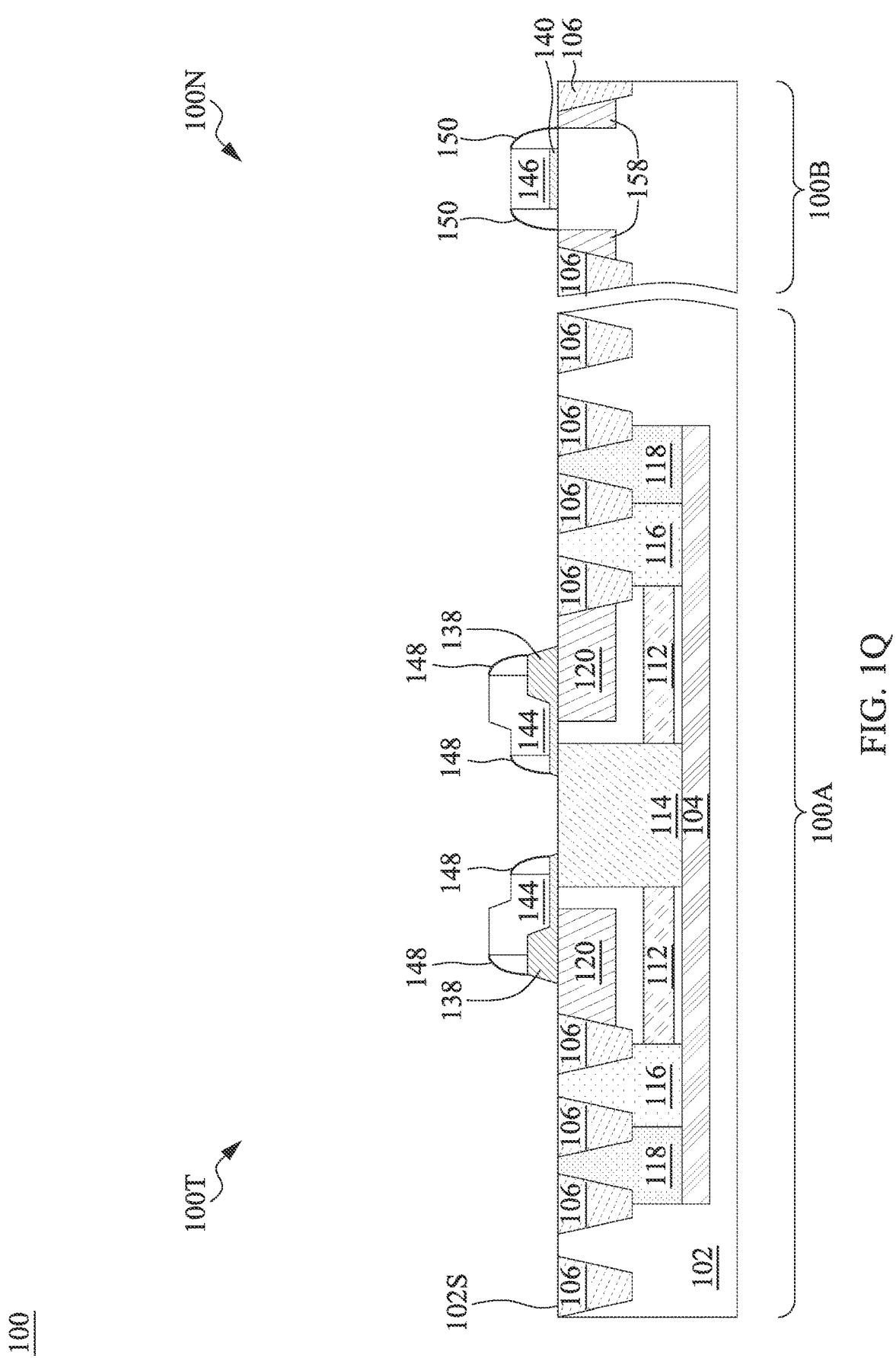
Figure 1R:
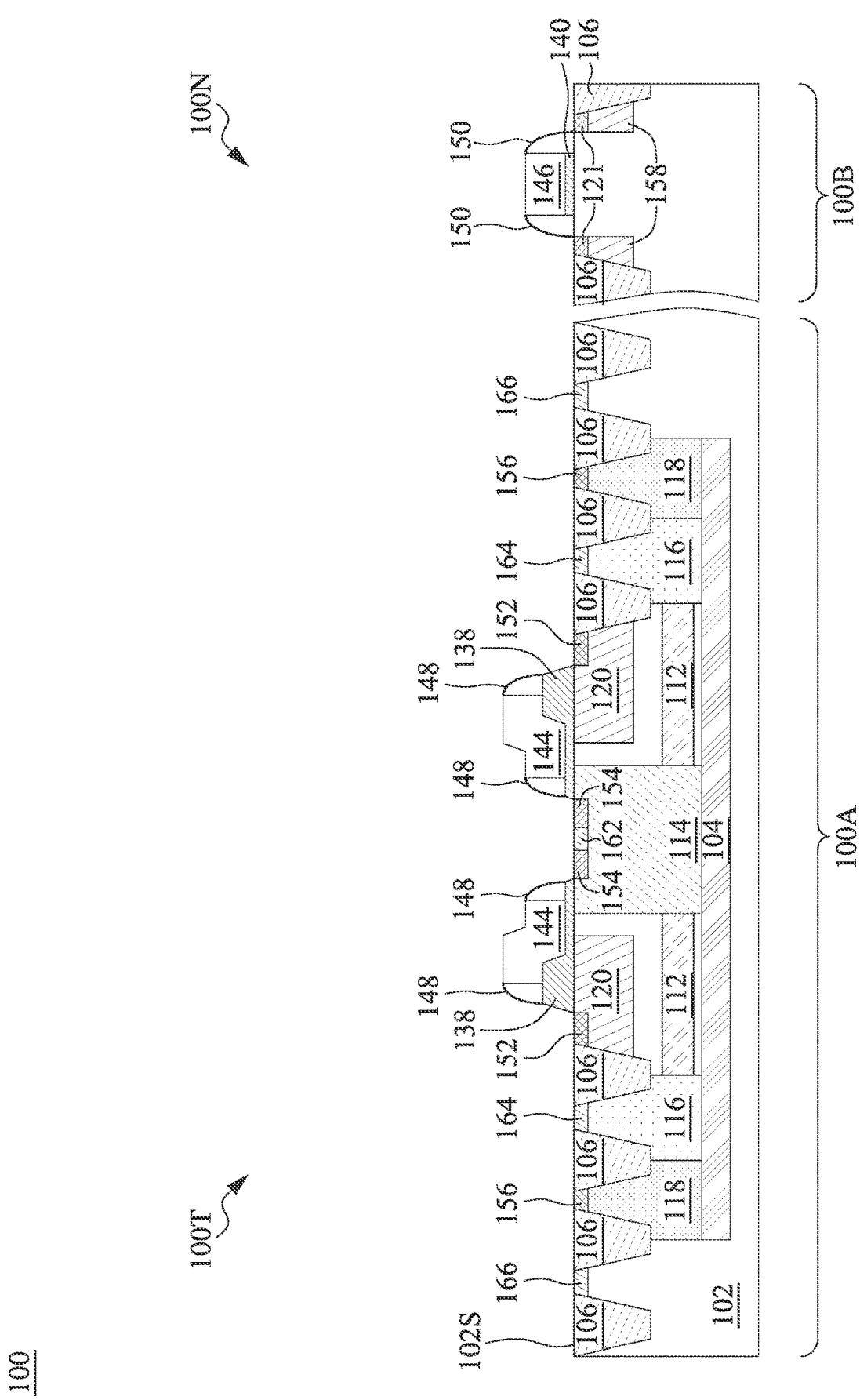
Figure 1S:
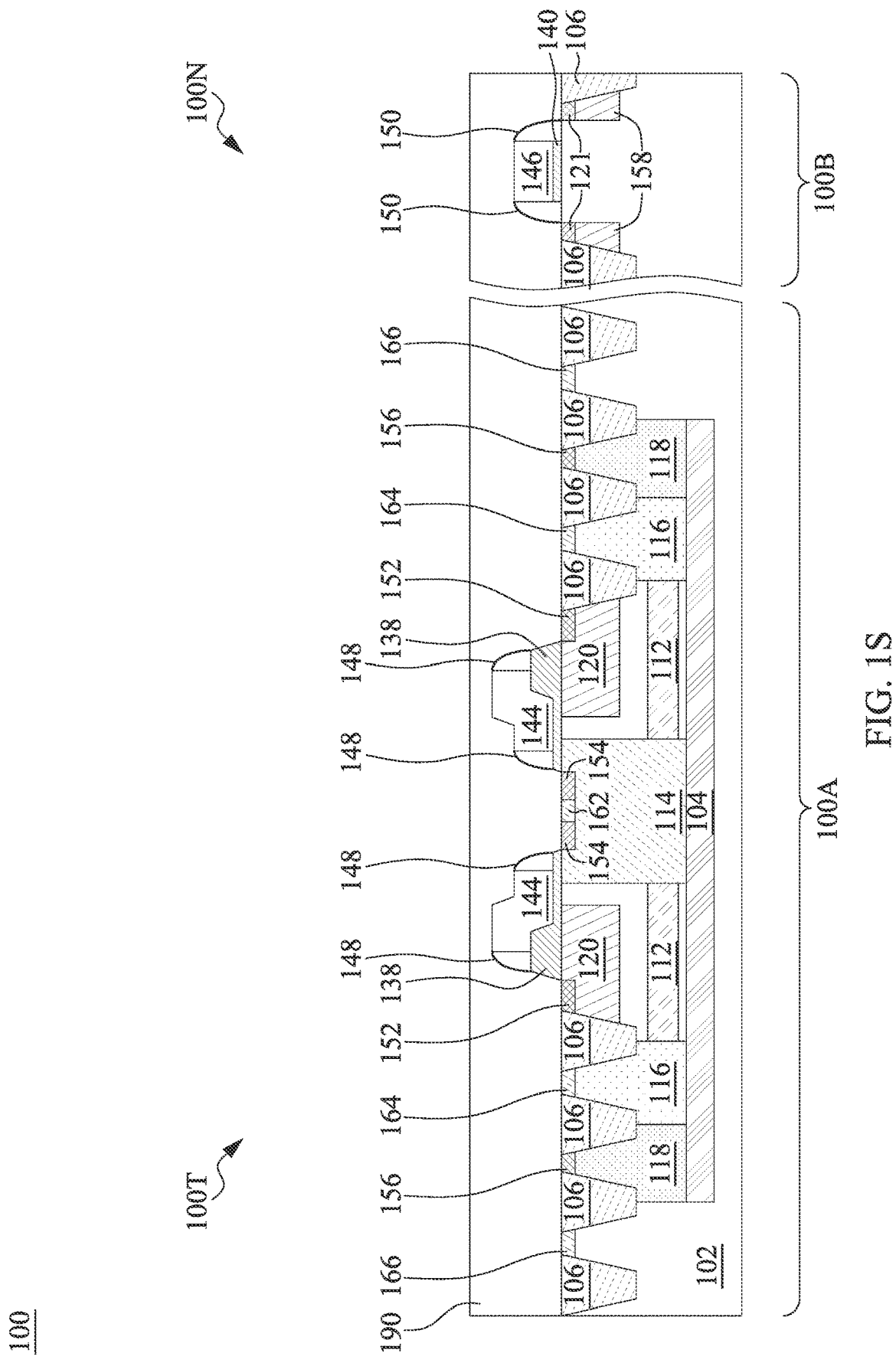
Figure 1T:
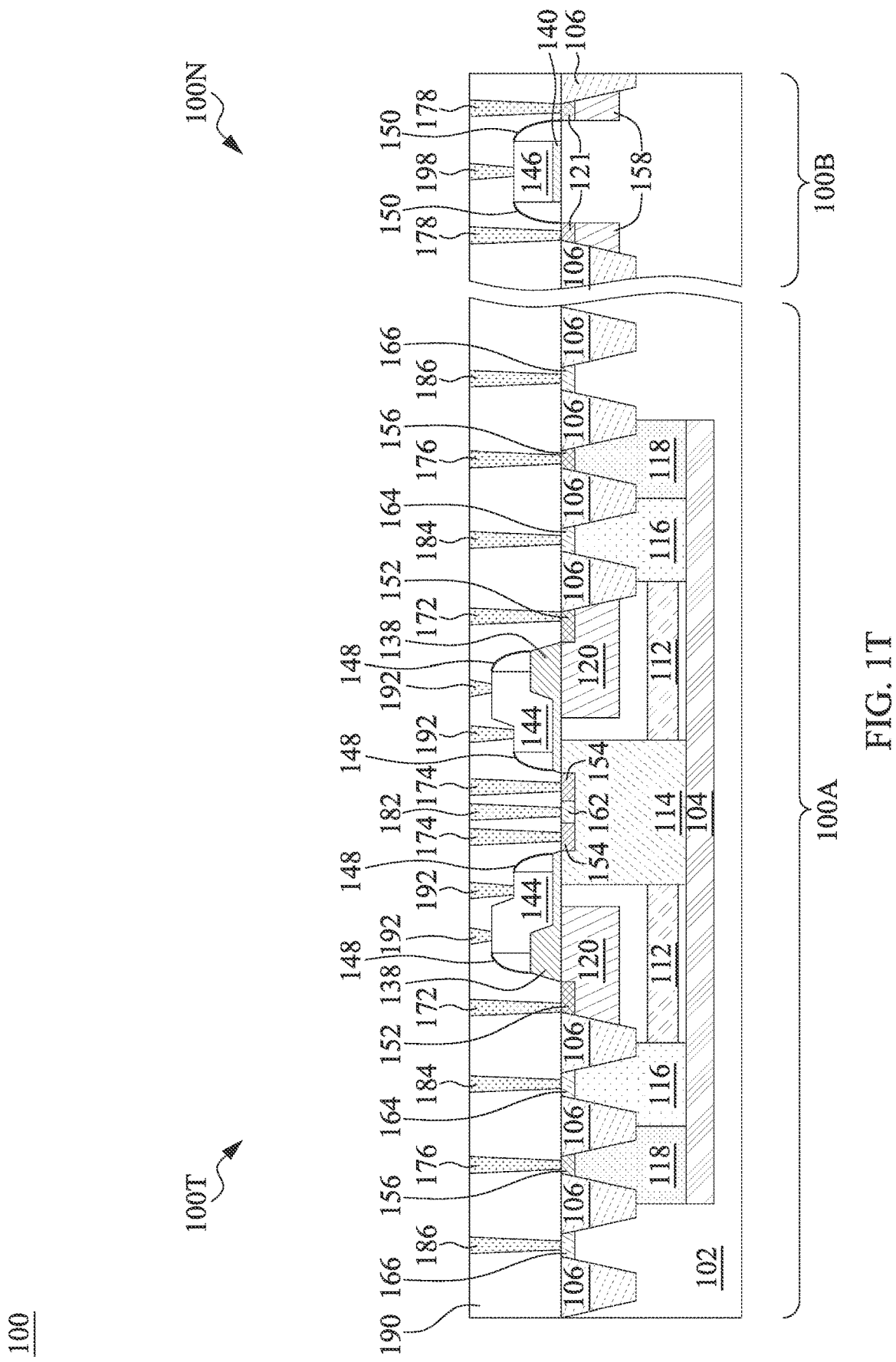

FIGS. 1A to 1T are cross-sectional views of intermediate stages of a method of forming a semiconductor device 100, in accordance with some embodiments of the present disclosure. In some embodiments, the semiconductor device 100 includes at least two zones 100A and 100B for forming transistors of different operation voltages.

The transistors of the semiconductor device 100 may include metal-oxide semiconductor (MOS) field-effect transistors (FET). In some embodiments, the zone 100A is referred to herein as an HV zone, and includes HV transistors, e.g., an example HV transistor 100T. In some embodiments, the zone 100B is referred to herein as a non-HV (NHV) zone, e.g., one or more of medium-voltage (MV) zones or low-voltage (LV) zones, and includes MV transistors or LV transistors, e.g., an example NHV transistor 100N (shown in FIG. 1U). Throughout the present disclosure, the term "HV transistor" refers to a transistor, e.g., a bipolar CMOS DMOS (BCD) transistor, that operates in a relatively high voltage range, e.g., the voltage may be greater than 5 volts, 10 volts, 20 volts, 30 volts or higher, and terms "NHV transistor" refers to an MV or LV transistor that operates in a medium or low operation voltage range, e.g., the operation voltage may be lower than 5 volts. In some embodiments, the operation voltage ranges for the various types of transistors, e.g., the HV transistor, the MV transistor, and the LV transistor, are varying based on different applications. In some embodiments, the operation voltage of the HV transistor is no less than that of the NHV transistor, and the operation voltage of the MV transistor is no less than that of the LV transistor. The category of the three types of transistors as discussed above is shown for illustration purposes. The semiconductor device 100 can include more than two zones for accommodating more than two types of transistors of the respective operation voltage ranges.

Referring to FIG. 1A, a substrate 102 is provided or formed. In some embodiments, the substrates 102 includes semiconductor material such as bulk silicon. In some embodiments, the substrate 102 includes other semiconductor materials, such as silicon germanium, silicon carbide, gallium arsenide, or the like. In the present embodiment, the substrate 102 is a P-type semiconductive substrate (acceptor type). In some other embodiments, an N-type semiconductive substrate (donor type) 102 can be used. Alternatively, the substrate 102 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the substrate 102 includes portions to form a semiconductor-on-insulator (SOI) substrate. In other alternatives, the substrate 102 may include a doped epitaxial layer, a gradient semiconductor layer, and/or a semiconductor layer overlaying another semiconductor layer of a different type, such as a silicon layer on a silicon germanium layer.

A barrier layer 104 is formed in the substrate 102. The barrier layer 104 is formed in a lower portion at a depth of the substrate 102, wherein barrier layer 104 and the higher portion of the substrate 102 over the barrier layer 104 are spared for the HV transistor 100T. The barrier layer 104 is also referred to herein as a buried layer. Furthermore, the barrier layer 104 is configured as an isolation layer such that noise resulting from different circuits arranged in other areas (not shown) of the substrate 102 may be shielded by the barrier layer 104. Thus, the electrical performance of the HV transistor 100T may be ensured. In an embodiment, the barrier layer 104 is a doped region doped with a different conductivity type than the semiconductor substrate 102. For example, the barrier layer 104 is doped with an N-type dopant in a P-type semiconductor substrate 102. In some embodiments, the barrier layer 104 is present only in the HV zone 100A for the HV transistors. In some embodiments, the NHV zone 100B are not used for forming HV transistors, and thus are free of any of barrier layers.

In some embodiments, the barrier layer 104 is formed by an ion implantation operation. The implantation dose and power are dependent upon the predetermined thickness and depth of the barrier layer 104. In some embodiments, a patterned mask layer (not separately shown) is formed over the substrate 102 to expose the HV zone 100A while covering the other zones, e.g., NHV zone 100B. The dopants, e.g., an N-type dopant such as arsenic, phosphorus, or the like, are implanted into substrate 102 in the region of the HV zone 100A with the patterned mask layer as an implantation mask. In some embodiments, after the ion implantation operation is completed, the pattern mask layer is stripped or removed.

Referring to FIG. 1B, a plurality of isolation regions 106 are formed on the upper surface 102S of the substrate 102. The isolation regions 106 may include electrically insulating materials or dielectric materials, such as silicon oxide; however, other dielectric materials, e.g., silicon nitride, silicon oxynitride, silicon carbide, or the like, are also possible for forming the isolation regions 106. In some embodiments, the isolation regions 106 are referred to as shallow trench isolation (STI) regions.

In an example procedure of forming the isolation regions 106, a plurality of trenches (not separately shown) are etched from the upper surface 102S of the substrate 102. The trenches are formed on the upper surface 102S in the HV zone 100A and the NHV zone 100B. The trenches may have substantially equal depths measured from the upper surface 102S. The trenches may be formed using a dry etch, a wet etch, a reactive ion etch (RIE), a combination thereof, of the like. The trenches are filled with the dielectric materials to form the isolation regions 106 using, e.g., chemical vapor deposition (CVD), physical vapor deposition (PVD), atomic layer deposition (ALD), oxidation, nitridation, in-situ steam generation (ISSG), spin-on coating, or other suitable deposition methods.

After the dielectric material of the isolation region 106 fills the trenches, a planarization operation, e.g., chemical mechanical polishing (CMP) or mechanical grinding, may be adopted to remove excess dielectric materials over the upper surface 102S and level the surface of the isolation regions 106 with the upper surface 102S.

In some embodiments, the isolation regions 106 are formed within the HV zone 100A and the NHV zone 100B, and at the boundary of the HV zone 100A and the NHV zone 100B for defining the boundary of different doped regions or well regions in the zones 100A, 100B or the boundary of each transistor in the respective zones 100A, 100B. The isolation regions 106 are also configured to electrically isolate adjacent transistors.

Referring to FIG. 1C, well regions 112 are formed in the substrate 102 over the barrier layer 104. The well regions 112 are formed as doped regions at the same level of the substrate 102 and separated from each other in the horizontal direction by a distance. In some embodiments, the well regions 112 are separated from the underlying barrier layer 104. In some embodiments, the well region 112 is a P-type well region. In some embodiments, a depletion region is formed between the N-type barrier layer 104 and the P-type well regions 112. The well region 112 may be formed using an ion implantation operation. The depth and profile of the well regions 112 are controlled by the recipes of the ion implantation operation. In some embodiments, the ion implantation operation may use P-type dopants, e.g., phosphor, with an implant dose in a range between about $1\times10^{10}$ and about $1\times10^{18}$ atoms/cm².

Subsequently, several doped regions are formed in the HV zone 100A. Referring to FIG. 1D, a source/drain region 114 is formed in the HV zone 100A between the well regions 112. The source/drain region 114 may include a dopant of a conductivity type, e.g., P-type, different from that of the barrier layer 104. In the present embodiment, the source/drain region 114 serves at a source terminal of the HV transistor 100T. The source/drain region 114 may be a doped region formed by an ion implantation operation with an implant dose between about $10^{10}$ atoms/cm² and about $10^{18}$ atoms/cm². Throughout the present disclosure, source/drain region(s) may refer to a source or a drain, individually or collectively dependent upon the context.

Referring to FIG. 1E, doped regions 116 are formed in the HV zone 100A. The doped regions 116 may include dopants of a conductivity type, e.g., P-type, the same as the source/drain regions 114. The doped regions 116 may be formed as doped regions by an ion implantation operation with an implant dose between about $10^{10}$ atoms/cm² and about $10^{18}$ atoms/cm². In some embodiments, the doped regions 114 are connected to form a ring shape from a top-view perspective. The doped regions 114 may be connected to the well region 112 to form a guard ring for reducing leakage current of the HV transistor 100T.

Referring to FIG. 1F, source/drain regions 120 is formed in the HV zone 100A. Each of the source/drain regions 120 is arranged between the source/drain region 114 and each of the well regions 112. The source/drain regions 120 may include a dopant of a conductivity type, e.g., N-type, same as that of the barrier layer 104. In the present embodiment, the source/drain regions 120 serve as the drain terminals of the HV transistor 100T. In some embodiments, the source/drain regions 120 are separated from the source/drain region 114 by a distance in the horizontal direction. In some embodiments, the source/drain regions 120 are separated from the well region 112 by a distance in the vertical direction. Channels of the HV transistor 100T are formed between the source/drain region 114 and each of the source/drain regions 120. The source/drain regions 120 may be doped regions formed by an ion implantation operation with an implant dose between about $10^{10}$ atoms/cm² and about $10^{18}$ atoms/cm².

Referring to FIG. 1G, doped regions 118 are formed in the HV zone 100A on the outer sides of the doped regions 116. The doped regions 118 may include dopants of a conductivity type, e.g., N-type, the same as the barrier layer 104. The doped regions 118 may be formed as doped regions by an ion implantation operation with an implant dose between about $10^{10}$ atoms/cm² and about $10^{18}$ atoms/cm². In some embodiments, the outer sidewalls of the doped regions 118 are aligned with sidewalls of the barrier layer 104. In some embodiments, the doped regions 118 are connected to form a ring shape from a top-view perspective. The doped regions 118 may be connected to the barrier layer 104 to form a guard ring for reducing leakage current of the HV transistor 100T.

The order of forming the doped regions 112, 114, 116, 118 and 120 may be changed, or they may be performed simultaneously. In some embodiments, a layer of pad oxide is deposited on the upper surface of the substrate 102 prior to the implantation of the doped regions 104, 112, 114, 116, 118 and 120 for protecting the upper surface 102S from damage by the implantation operations. The pad oxide may be removed after the implantation operations are completed.

FIGS. 1H to 1O illustrate the formation of gate dielectric layers 138 of the HV transistor 100T. Referring to FIG. 1H, a first dielectric layer 122, a second dielectric layer 124 and a bottom antireflective coating (BARC) 126 are successively deposited in a blanket manner over the substrate 102. The first dielectric layer 122 may be a nitrogen-free dielectric layer, e.g., silicon oxide or other suitable dielectric materials. In some embodiments, the second dielectric layer 124 is a nitrogen-containing dielectric layer, e.g., silicon nitride, silicon oxynitride or other suitable dielectric materials. The first dielectric layer 122, the second dielectric layer 124 and the BARC layer 126 may be formed using CVD, PVD, ALD, ISSG, or other suitable deposition methods. In some embodiments, patterned photoresist layers 128 are formed over the BARC 126. The patterned photoresist layer 128 defines a thicker portion P1 (see FIG. 2) of the gate dielectric layer 138, in which the thicker portion P1 is configured to withstand a high biasing voltage applied to a drain terminal of the HV transistor 100T such that the breakdown voltage of the HV transistor 100T can be increased.

Referring to FIG. 1I, the BARC 126 is patterned to formed mask layers 130 over the second dielectric layer 124. The mask layers 130 are patterned using the patterned photoresist layers 128 as a patterning mask. In some embodiments, the patterning operation includes photolithography and etching operations. The etching operation may include a dry etch or the like.

Referring to FIG. 1J, the second dielectric layer 124 is patterned to form first sublayers 132 of gate dielectric layers 138 over the first dielectric layer 122. The first sublayers 132 are patterned using the mask layers 130 as patterning masks. In some embodiments, the patterning operation includes photolithography and etching operations. The etching operation may include a dry etch or the like.

Referring to FIG. 1K, the first dielectric layer 122 is patterned to form second sublayers 134 of the gate dielectric layers 138 over the substrate 102. The second sublayers 134 are patterned using the first sublayers 132 as patterning masks. In some embodiments, the first dielectric layer 122 is thinned during the patterning operation and a thickness of the first dielectric layer 122 is left unetched. In some embodiments, a thickness ratio of the residual first dielectric layer 122 to the original first dielectric layer 122 may be in a range between about 0.5 to about 0.7. Therefore, the substrate 102 may be still covered by the first dielectric layer 122 after the patterning operation of the first dielectric layer 122. In some embodiments, the patterning operation includes photolithography and etching operations. The etching operation may include a dry etch or the like.

FIG. 1L illustrates a cleaning operation 135 of the HV transistor 100T. The cleaning operation 135 includes a wet etching operation to remove the residual thickness of the first dielectric layer 122 uncovered by the first sublayers 132, or undesired foreign matters on the upper surface 102S and surfaces of the first sublayers 132 and the second sublayers 134. The cleaning operation 135 may be performed using a combination of HF, APM (Ammonium Peroxide Mixture) and SPM (Sulfuric acid-Hydrogen Peroxide Mixture). In some embodiments, the widths of the first sublayers 132 and the second sublayers 134 are reduced, e.g., by less than 1%, after the cleaning operation 135. In some embodiments, the cleaning operation is performed using chemicals free of phosphoric-acid.

Referring to FIG. 1M, another dielectric layer 137 is deposited over the substrate 102 and the first sublayers 132. In some embodiments, the dielectric layer 137 includes a same material as the first dielectric layer 122 or the second sublayers 134, e.g., silicon oxide. Composite dielectric layers 136 are formed accordingly as gate dielectric layers. The height of the composite dielectric layers 136 may be greater than the heights of the first sublayers 132 due to the deposition of the dielectric layer 137 over the first sublayers 132. The dielectric layer 137 may be formed using CVD, PVD, ALD, ISSG, furnace annealing or other suitable deposition methods. In some embodiments, the deposition of the dielectric layer 137 is performed by annealing the substrate 102 at a temperature between about 400° C. and about 1200° C.

In some embodiments, the operation for forming the dielectric layer 137 also aids in converting at least part of the nitrogen-containing dielectric material of the first sublayers 132 into a nitrogen-free dielectric material. The process gas, e.g., water or air, supplies oxygen elements to the first sublayers 132 during an annealing operation and converts the nitrogen-containing dielectric material or nitride into oxide. In some embodiments, the first sublayers 132 is at least partially (e.g., a portion 132A) converted into silicon oxide by the ISSG method or thermal oxidation. In some embodiments, an oxidation process occurs that at least the nitrogen elements near the surfaces of the first sublayers 132 is replaced by oxygen elements during the formation of the dielectric layer 137. In some embodiments, the core part 132B of the first sublayers 132 not exposed or the lower part of the first sublayers 132 adjacent to the second sublayers 134 are not exposed to oxygen and thus are kept unchanged during the oxidation process. As a result, at least the portion 132A of the resulting composite dielectric layer 136 close to the surface of the first sublayers 132 is converted into the material of the second sublayers 134 or the dielectric layer 137.

Referring to FIG. 1N, a patterning operation is performed to pattern the composite dielectric layer 136. As a result, gate dielectric layers 138 are left in the HV zone 100A, and the upper surface 102S is partially exposed through the patterning operation. In some embodiments, the upper surface 102S in the NHV zone 100B is completely exposed. In some embodiments, the upper surfaces of the gate dielectric layers 138 have a stepped profile.

In some embodiments, a gate dielectric layer 140 is formed over the upper surface 102S in the NHV zone 100B. The gate dielectric layer 140 is used as a gate dielectric layer for a NHV transistor 100N that is to be formed later. In some embodiments, the gate dielectric layer 140 has a thickness less than that of the gate dielectric layer 137 or 136, and thus is formed after the formation of the gate dielectric layer 137 or 136.

Referring to FIG. 1O, a silicon layer 142 is deposited over the substrate 102 and covers the gate dielectric layers 136 and 140. In some embodiments, the silicon layer 142 includes undoped polysilicon. The silicon layer 142 may be formed using CVD, PVD, ALD, or other suitable methods. Subsequently, as shown in FIG. 1P, the silicon layer 142 is patterned to form a pair of gate electrodes 144 over the pair of gate dielectric layers 138. The patterning operation may be performed using photolithography and etching operations. The etching operation may include a dry etch, a wet etch, a combination thereof, or the like. Due to the stepped profile of the gate dielectric layers 138, the overlying gate electrodes 144 also include a stepped shape. In some embodiments, referring to FIG. 1P and FIG. 2, the gate electrodes 144 is contiguous from a location above the thicker portion P1 of the gate dielectric layer 138 to a location above the thinner portion P2 of the gate dielectric layer 138, and thus the gate electrodes 144 are referred to herein as a hybrid gate electrode. In some embodiments, the thicker portion P1 of the gate dielectric layer 138 extend beyond the sidewall of the gate electrodes 144. In some embodiments, the configuration of the hybrid gate electrode 144 is suitable for an N-type HV transistor 100T.

In some embodiments, the patterning operation of the gate electrodes 144 also forms a gate electrode 146 of the NHV transistor 100N in the NHV zone 100B. Since the gate dielectric layer 140 has a flat upper surface, the overlying gate electrode 146 also has a flat upper surface. In some embodiments, the gate electrodes 144 and 146 have substantially equal thicknesses.

In some embodiments, an ion implantation operation is performed on the gate electrodes 144 or 146. In some embodiments, the ion implantation operation is performed by implanting N-type dopants, e.g., arsenic, or P-type dopants, e.g., boron, into the gate electrode 144 or 146.

Figure 2:
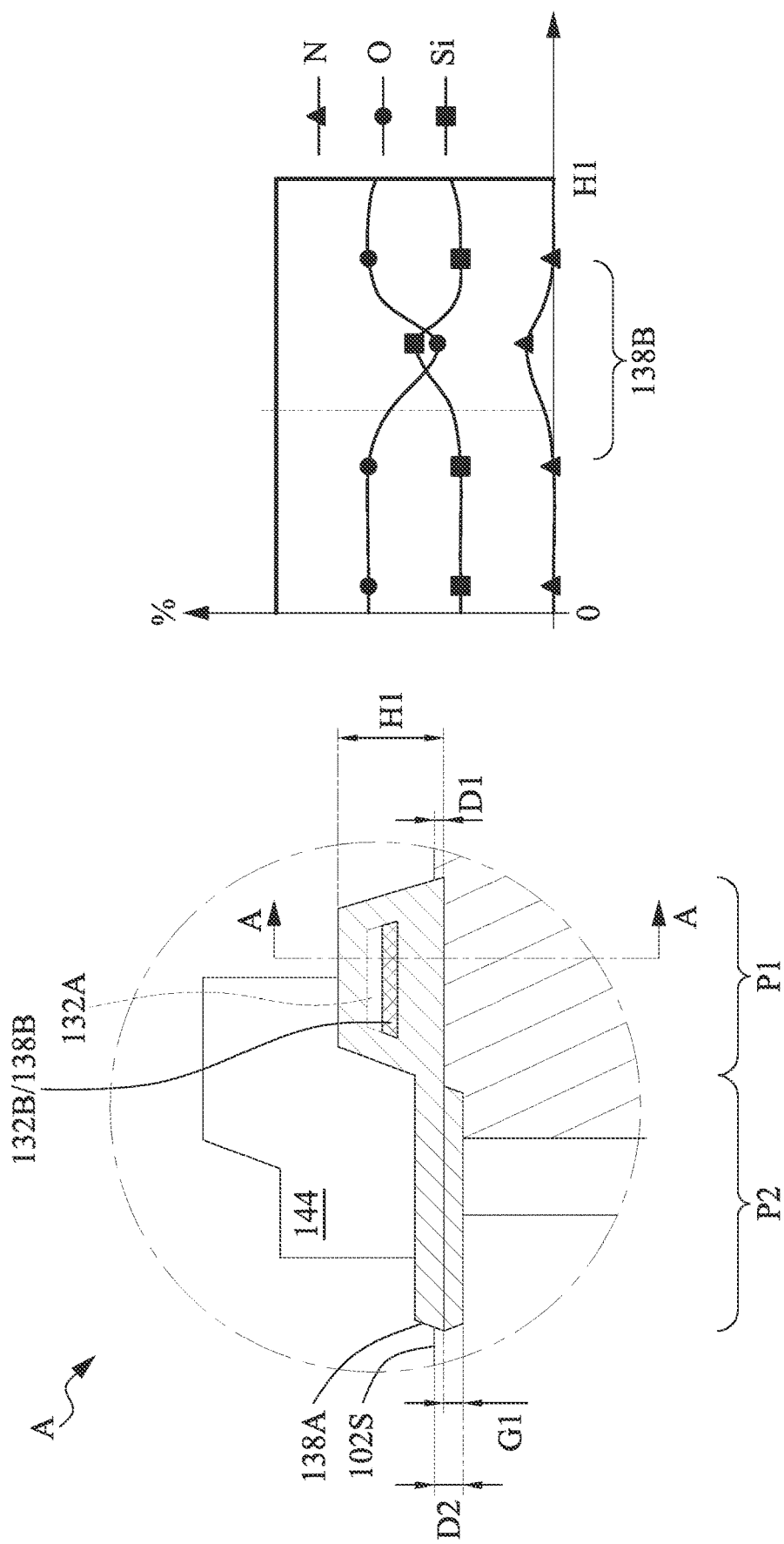
FIG. 2 shows a concentration distribution of elements of a dielectric layer along a vertical direction, in accordance with some embodiments of the present disclosure.

Referring to FIG. 2, a left subfigure illustrates an enlarged view of a portion A1 of the HV transistor 100T shown in FIG. 1P, in accordance with some embodiments of the present disclosure. Only the gate dielectric layer 138 and the gate electrode 144 of the HV transistor 100T are shown in the left subfigure for clarity. The gate dielectric layer 138 includes a nitrogen-free portion 138A and a nitrogen-containing portion 138B, in which the nitrogen-containing portion 138B is wrapped around or surrounded by the nitrogen-free portion 138A. In some embodiments, the nitrogen-containing portion 138B includes or is formed of silicon oxynitride or silicon nitride, while the nitrogen-free portion 138A includes or is formed of silicon oxide. In some embodiments, the nitrogen element has a distribution in the gate dielectric layer 138, and thus the boundary between the nitrogen-free portion 138A and the nitrogen-containing portion 138B is blurred.

Referring to FIGS. 1N, 1M and 2, in some embodiments, the nitrogen-free portion 138A includes three parts or sublayers: the first part (sublayer) comes from the deposition and patterning of the first dielectric layer 122, which forms the bottom portion (i.e., the second sublayers 134 as shown in FIG. 1L) of the thicker region P1 under the nitrogen-containing portion 138B of the gate dielectric layer 138; the second part (sublayer) comes from the dielectric layer 137, which also forms the thinner region P2 of the gate dielectric layer 138 and a topmost portion of the thicker region P1 of the gate dielectric layer 138 during the formation of the dielectric layer 137, e.g., using the ISSG deposition method or annealing; and the third part (sublayer) 132A comes from the conversion of the nitrogen-containing material, e.g., silicon oxynitride or silicon nitride, into the nitrogen-free material, e.g., silicon oxide. In some embodiments, some of the portion 132B (sublayer) is converted into the oxygencontaining material, e.g., silicon oxynitride. Based on the abovementioned three parts of the nitrogen-free portion 138A, the nitrogen-containing portion 138B is enclosed by the nitrogen-free portion 138A and separated from other features by the nitrogen-free portion 138A. In some embodiments, the nitrogent-containing portion 138B of the gate dielectric layer 138 is higher than the dielectric layer 137 and is closer to the source/drain region 120 than to the second source/drain region 141.

In some embodiments, the first sublayers 132, the second sublayers 134 and the dielectric layer 137 constitutes three sublayers respectively of the gate dielectric layers 138 of the HV transistor 100T, or alternatively, they can be regarded as three overlaid gate dielectric layers of the same HV transistor 100T.

A right subfigure of FIG. 2 shows a concentration distribution of elements along a sectional line AA traversing the thicker region P1 of the gate dielectric layer 138. In some embodiments, the gate dielectric layer 138 includes three major elements, i.e., silicon, nitrogen and oxygen. The concentration of the nitrogen element is zero or almost negligible near the bottom portion at the height zero and the top portion at the height H1 of the thicker region P1. The presence of the nitrogen element, corresponding to the shape of the nitrogen-containing portion 138B shown in the left subfigure, has a peak concentration around a middle level of the thicker region P1 of the gate dielectric layer 138. As explained previously, the nitrogen element in the portion 132A of the thicker region P1 is converted into oxide through the oxidation operation performed in FIG. 1M. Further, the oxygen element has a lower concentration around the nitrogen-containing portion 138B than the nitrogen-free portion 138A in the thicker region P1. The silicon element has a higher concentration around the nitrogen-containing portion 138B than the nitrogen-free portion 138A in the thicker region P1, with a trend similar to that of the nitrogen element.

In some embodiments, the formation of the dielectric layer 137 or the nitrogen-free portion 138A includes oxidation of a portion of the substrate 102 around the surface 102A. As a result, an amount of silicon in the substrate 102 is consumed to form a silicon oxide layer on the upper surface 102S, and such silicon oxide layer constitutes a portion of the nitrogen-free portion 138A of the gate dielectric layer 138. In some embodiments, the oxidation performance on the substrate 102 is dependent upon the oxygen penetration ability into the substrate 102 from above the upper surface 102S. In some embodiments, the thicker portion P1 prevents more oxygen atoms from penetrating into the substrate 102 as compared to the thinner portion P2, and thus the amount of oxidized silicon in the substrate 102 underlying the thicker portion P1 is less than that of the substrate 102 underlying the thinner portion P2.

Referring to the left subfigure of FIG. 2, in some embodiments, the second sublayers 134 has a first depth D1 extending into the substrate 102, and the dielectric layer 137 has a second depth D2, greater than the first depth D1, extending into the substrate 102. As a result, the nitrogen-free portion 138A has depth difference D2-D1=G1 between the thicker portion P1 and the thinner portion P2. In some embodiments, the nitrogen-free portion 138A has a bottom surface in the thicker region P1 higher than a bottom surface in the thinner region P2 by the depth difference G1.

In some embodiments, the thicker portion P1 and the thinner portion P2 of the gate dielectric layer 138 serve different functions. The thicker portion P1 may be used mainly for withstanding high operation voltages, while the thinner portion P2 may be used mainly for electrically insulating the gate electrode 144 from the channel in the substrate 102 to ensure proper functions of the HV transistor 100T. In some embodiments, the channels of the HV transistor 100T is formed under the thinner portion P2 and covered by the thinner portion P2, rather than by the thicker portion P1. In some embodiments, a thickness ratio between the thicker portion P1 and the thinner portion P2 is in a range between about 1.5 and about 3.

The proposed gate dielectric layer 138 provides advantages. Referring to FIG. 1L, existing approaches of forming the gate dielectric layers 138 may remove the nitrogen-containing first sublayers 132 and leave only the nitrogen-free second sublayers 134. That is because the nitrogen element may adversely interact with other features during the subsequent photolithography operation, and therefore it should be cleared after the patterning operation of the second sublayers 134 is completed and prior to another photolithography operation. However, in some cases, the cleaning chemistry for removing the first sublayers 132 generally involves phosphoric acid ($H_3PO_4$), which may contain a very low amount of metallic elements which would interact with silicon of the substrate 102, e.g., via a Galvanic effect, with charges and oxidize the upper surface 102S of the substrate 102 into an oxide film. When a subsequent cleaning operation is performed, e.g., using HF, the oxide film formed on the upper surface 102S may be etched away, leaving surface defects on the upper surface 102S. The device reliability of the HV transistor 100T may thus be degraded.

In contrast, the outer portion of the gate dielectric layer 138, i.e., the nitrogen-free portion 138A is formed to wrap around the inner portion of the gate dielectric layer 138, i.e., the nitrogen-containing portion 138B. As a result, the step of removing the first sublayers 132 can be omitted. Although the nitrogen-containing portion 138B is not totally removed, it will not cause harm to the photolithography operation since the entire nitrogen-containing portion 138B is isolated by the nitrogen-free portion 138A. In addition, the proposed sandwich-type gate dielectric layer 138 is formed with greater thickness than that formed with the existing methods, and thus the voltage-resistance performance of the gate dielectric layer 138 is enhanced, and the processing cost of forming the gate dielectric layer 138 can be reduced.

Referring to FIG. 1Q, gate spacers 148 (or sidewall spacers) are formed on sidewalls of the gate electrodes 144 in the HV zone 100A. Further, gate spacers 150 are formed on sidewalls of the gate electrode 146 in the NHV zone 100B. In some embodiments, the gate spacers 148 are formed of dielectric layers, such as oxide, nitride, carbide, oxynitride, high-k dielectric materials, or other suitable dielectric materials. In some embodiments, the gate spacers 148 include a single layer or multilayer structure. The gate spacers 148 or the gate spacer 150 may be formed simultaneously in a single formation operation, or they may be formed separately. The gate spacers 148 and 150 may be formed by depositing one or more layers of dielectric materials in a conformal manner, followed by etching the horizontal portion of the dielectric material. The vertical portion of the dielectric material is left on the sidewalls of the gate electrodes 144, 146 to thereby form the gate spacers 148 and 150.

In some embodiments, source/drain regions 121 are formed in the NHV zone 100B after the gate electrode 144 is formed. Each of the source/drain regions 121 is arranged between one of the gate spacers 150 and an adjacent isolation region 106. The source/drain regions 121 may include a dopant of a conductivity type, e.g., N-type, same as that of the barrier layer 104, or a conductivity type, e.g., P-type, different from that of the barrier layer 104. In some embodiments, the source/drain regions 121 are separated by a distance in the horizontal direction. A channel of the NHV transistor 100N is formed between the source/drain regions 121. The source/drain region 121 may be doped regions formed by an ion implantation operation with an implant dose between about $10^{10}$ atoms/cm and about $10^{18}$ atoms/cm$^2$.

Referring to FIG. 1R, doped regions 152, 154, 156 and 158 are formed on the upper surface 102S in the corresponding doped regions 120, 114, 118 and 121. The doped regions 152, 154, 156 and 158 may have a conductivity type the same as the corresponding doped regions 120, 114, 118 and 121. The doped regions 152, 154, 156 and 158 may have doping concentrations greater than those of the corresponding doped regions 120, 114, 118 and 121 for reducing contact resistance. The doped regions 152, 154, 156 and 158 may be formed using an ion implantation operation.

Likewise, referring to FIG. 1R, doped regions 162, 164 and 166 are formed on the upper surface 102S in the corresponding doped regions 114, 116 and the substrate 102. The doped regions 162, 164 and 166 may have a conductivity type the same as the corresponding doped regions 114, 118 and the substrate 102. The doped regions 162, 164 and 166 may have doping concentrations greater than those of the corresponding doped regions 114, 116 and the substrate 102 for reducing contact resistance. The doped regions 162, 164 and 166 may be formed using an ion implantation operation. In some embodiments, the doped region 162 is configured to form a contact of a body terminal of the HV transistor 100T, and is electrically connected to the doped region 114. In some embodiments, the doped region 162 is omitted.

Referring to FIG. 1S, an interlayer dielectric (ILD) layer 190 is formed over the substrate 102 and the gate electrodes 144, 146. The ILD layer 190 may include a dielectric material, such as silicon nitride, silicon oxide, or other suitable material. In some embodiments, the ILD layer 190 may be deposited over the substrate 102 and the gate electrodes 144, 146, followed by a planarization operation, such as chemical mechanical planarization (CMP), grinding, or other suitable planarization methods. The upper surface of the ILD layer 190 may be higher than the upper surfaces of the gate electrodes 144 or 146.

Referring to FIG. 1T, several conductive vias are formed in the ILD layer 190. One or more conductive vias 172, 174, 176 and 178 formed in the HV zone 100A or the NHV zone 100B are electrically coupled to the doped regions 152, 154, 156 and 158. One or more conductive vias 182, 184 and 186 formed in the HV zone 100A are electrically coupled to the doped regions 162, 164 and 166. Conductive vias 192 are electrically coupled to the gate electrodes 144, while a conductive via 198 is electrically coupled to the gate electrodes 146. The conductive vias 172, 174, 176, 178, 182, 184, 186, 192 and 198 may be formed by etching openings through the ILD layer 190 by a patterning operation. A conductive material may fill the openings to electrically connect the underlying structures (e.g., doped regions 152, 154, 156, 158, 162, 164 and 166, and gate electrodes 144 and 146) to overlying structures (not separately shown). The conductive material of the conductive vias 172, 174, 176, 178, 182, 184, 186, 192 and 198 may include, but is not limited to, titanium, tantalum, titanium nitride, tantalum nitride, copper, copper alloys, nickel, tin, gold, or combinations thereof.

During operation, the channels are formed between the source/drain region 114 and each of the source/drain regions 120. Since the gate dielectric layers 138 are thickened to withstand high operation voltages, the channel length can be shortened without the adverse effect of breakdown. Therefore, the device size can be decreased without impacting the high-voltage operation. In contrast, an existing HV transistor includes a gate dielectric layer, which is formed by removing the first sublayers 132 without converting the first sublayers 132 into a portion of the gate dielectric layer. As a result, the thickness ratio of the proposed gate dielectric layers 138 to an existing gate dielectric layer is between about 1.2 and about 2. Therefore, the durability of the proposed gate dielectric layers 138 is improved significantly such that the lifetime of the proposed HV transistor 100T is increased to around one hundred year from less than ten years of the existing HV transistor.

Figure 3:
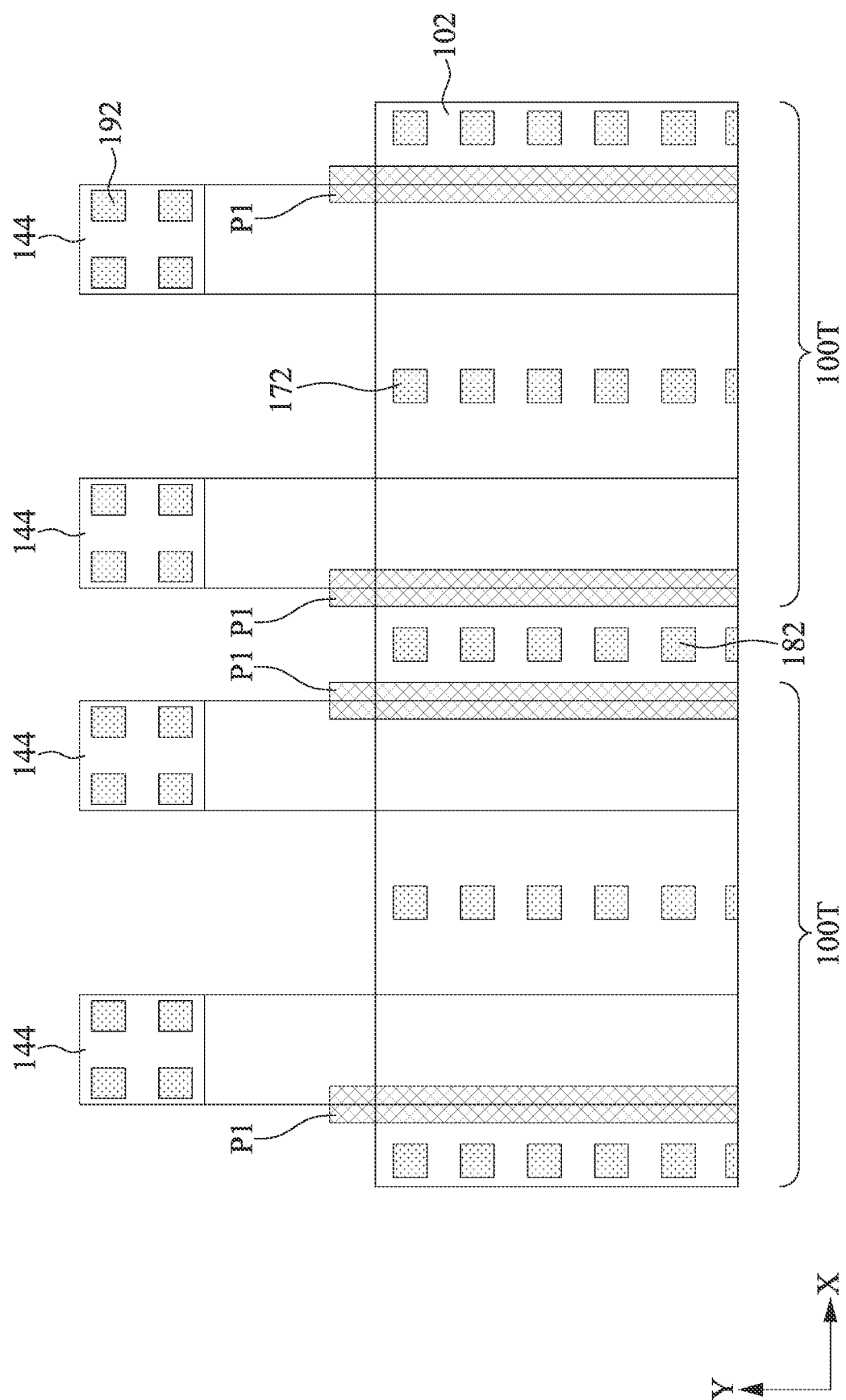
FIG. 3 shows a design layout of semiconductor devices, in accordance with some embodiments of the present disclosure.

FIG. 3 shows a design layout of the HV transistor 100T, in accordance with some embodiments of the present disclosure. The design layout shown in FIG. 3 only illustrates the gate electrodes 144, first portions P1 of the gate dielectric layers 138, the substrate 102, and the conductive vias 172 and 182. Other features are omitted from the design layout of FIG. 3 for clarity. Further, a plurality of conductive vias 192 are shown overlaid with the gate electrodes 144. In some embodiments, the gate electrodes 144 and the first portions P1 extend in the Y-axis, in which the gate electrodes 144 have greater lengths than the first portions P1 of the gate dielectric layers 138.

FIGS. 4A to 4E are cross-sectional views of intermediate stages of a method of forming an HV transistor 101T, in accordance with some embodiments of the present disclosure. The HV transistor 101T is similar to the HV transistor 100T in many aspects, and these similar aspects will not be repeated for brevity. In some embodiments, the HV transistor 101T includes doped regions 312, 314, 316 and 320 formed in the substrate 102, in which the locations and shapes of the doped regions 312, 314, 316 and 320 are similar to those of the doped regions 114, 116 and 120 formed in the HV transistor 100T shown in FIGS. 1A to 1G. In some embodiments, the HV transistor 100T in the present embodiment is an N-type transistor, while the HV transistor 101T in the present embodiment is a P-type transistor. Therefore, the doped regions 312 and 320 include P-type dopants, while the doped regions 314 and 316 include N-type dopants.

In some embodiments, a doped region 318 is formed within the doped region 314. The doped region 318 may have a conductivity type similar to that of the doped region 314, e.g., N-type. In some embodiments, the doped region 318 has a doping concentration greater than the doped region 314.

Figure 4A:
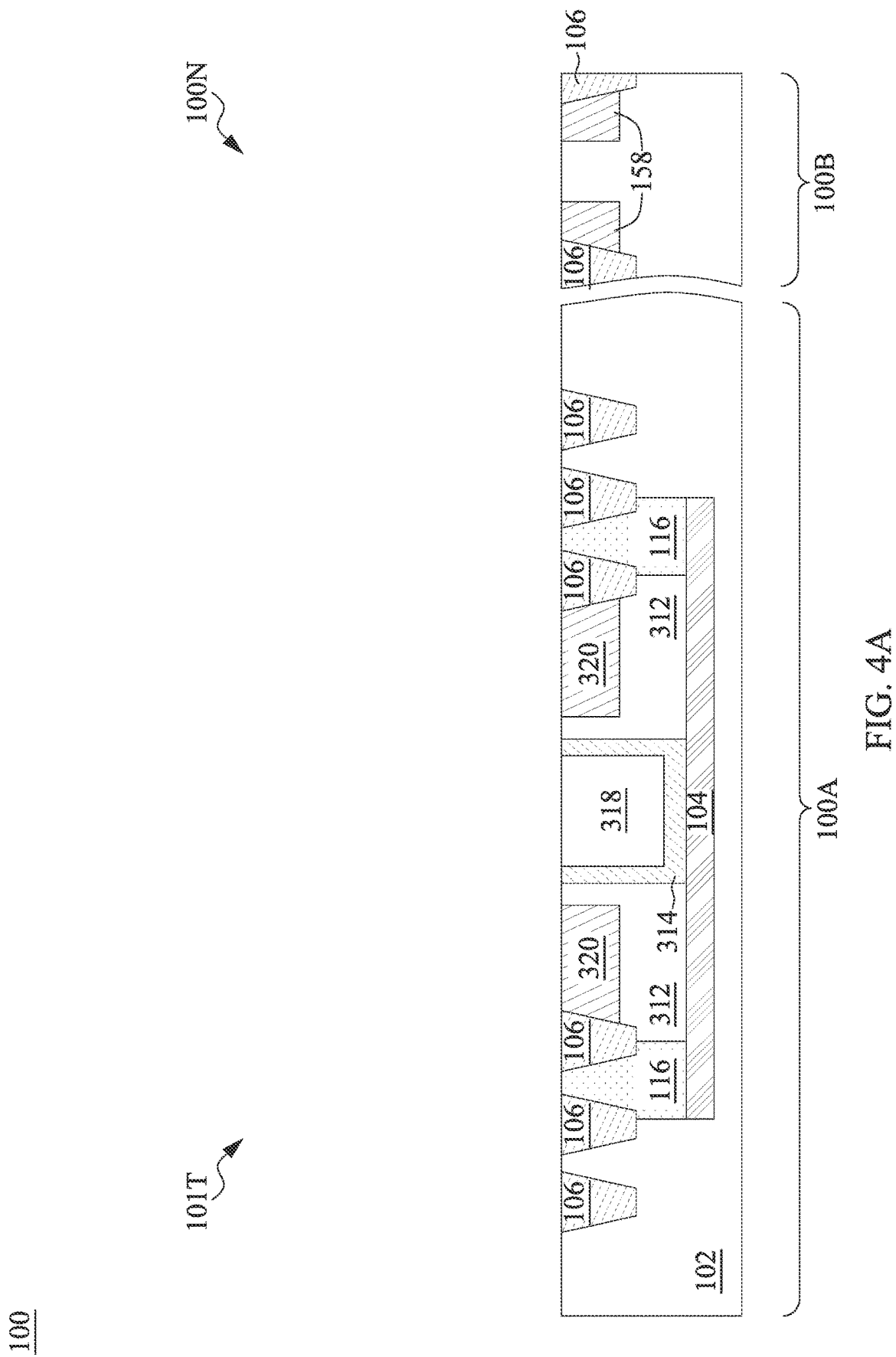
FIGS. 4A to 4E are cross-sectional views of intermediate stages of a method of forming a semiconductor device, in accordance with some embodiments of the present disclosure.
Figure 4B:
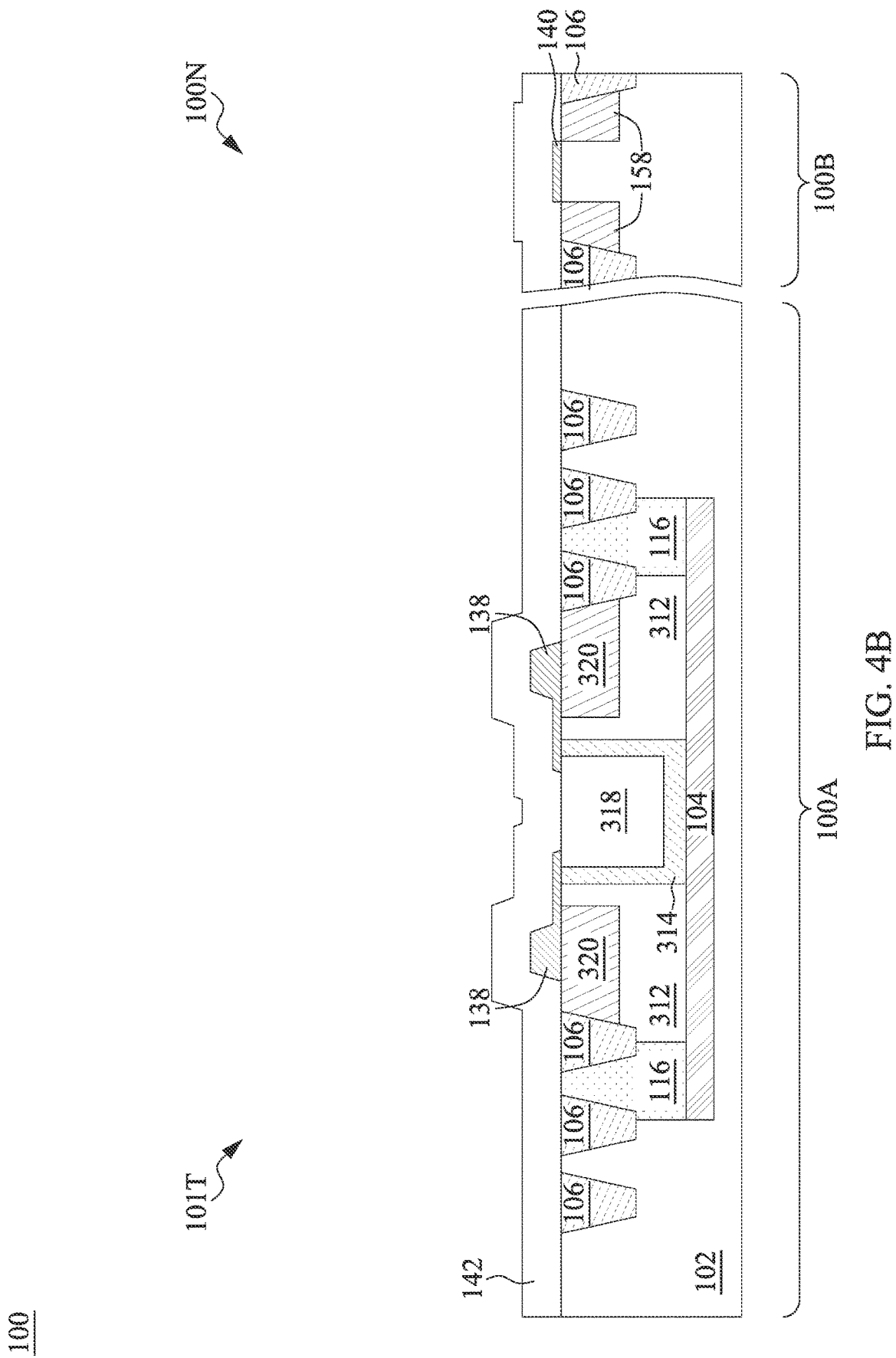

Referring to FIG. 4B, the gate dielectric layers 138 and 140 are formed over the substrate 102, in a manner similar to that described with reference to FIGS. 1H to 1N. In some embodiments, a silicon layer 142 is deposited over the substrate 102 and the gate dielectric layers 138, 140, in a manner similar to that described with reference to FIG. 1O.

Figure 4C:
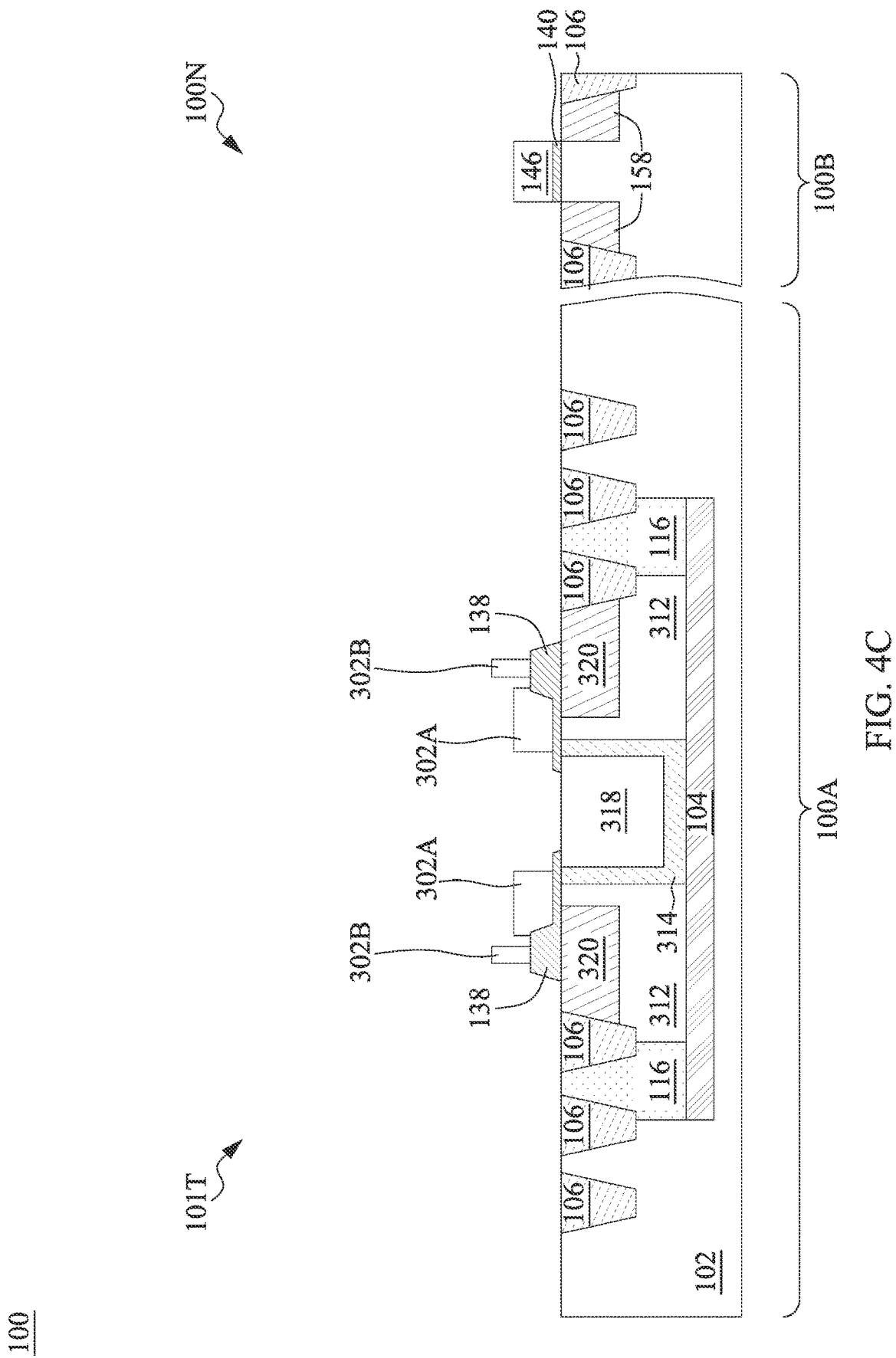

Referring to FIG. 4C, a patterning operation is performed to form gate electrodes 302. Each of the gate electrodes 302 is patterned to include a first region 302A and a second region 302B, in which the first region 302A and the second region 302B are split and separated by a distance, and hence the gate electrode 302 is referred to herein as a split gate electrode. The first region 302A is formed in a location (directly) over the thinner portion P2, while the second region 302B is formed in a location (directly) over the thicker portion P1. As a result, the coupling capacitance between the substrate 102 and the gate electrode 302 may be decreased due to the lifting up of the second region 302B farther away from the substrate 102. The operation speed of the HV transistor 101T can be thus increased. In some embodiments, the channels are arranged under the first region 302A and is biased mainly according to the first region 302A. In some embodiments, the first region 302A has an area or width greater than an area or a width of the second region 302B. In some embodiments, the first region 302A is overlapped with both of the thicker portion P1 and the thinner portion P2. In some embodiments, the second region 302B is fully overlapped with the thicker portion P1.

Figure 4D:
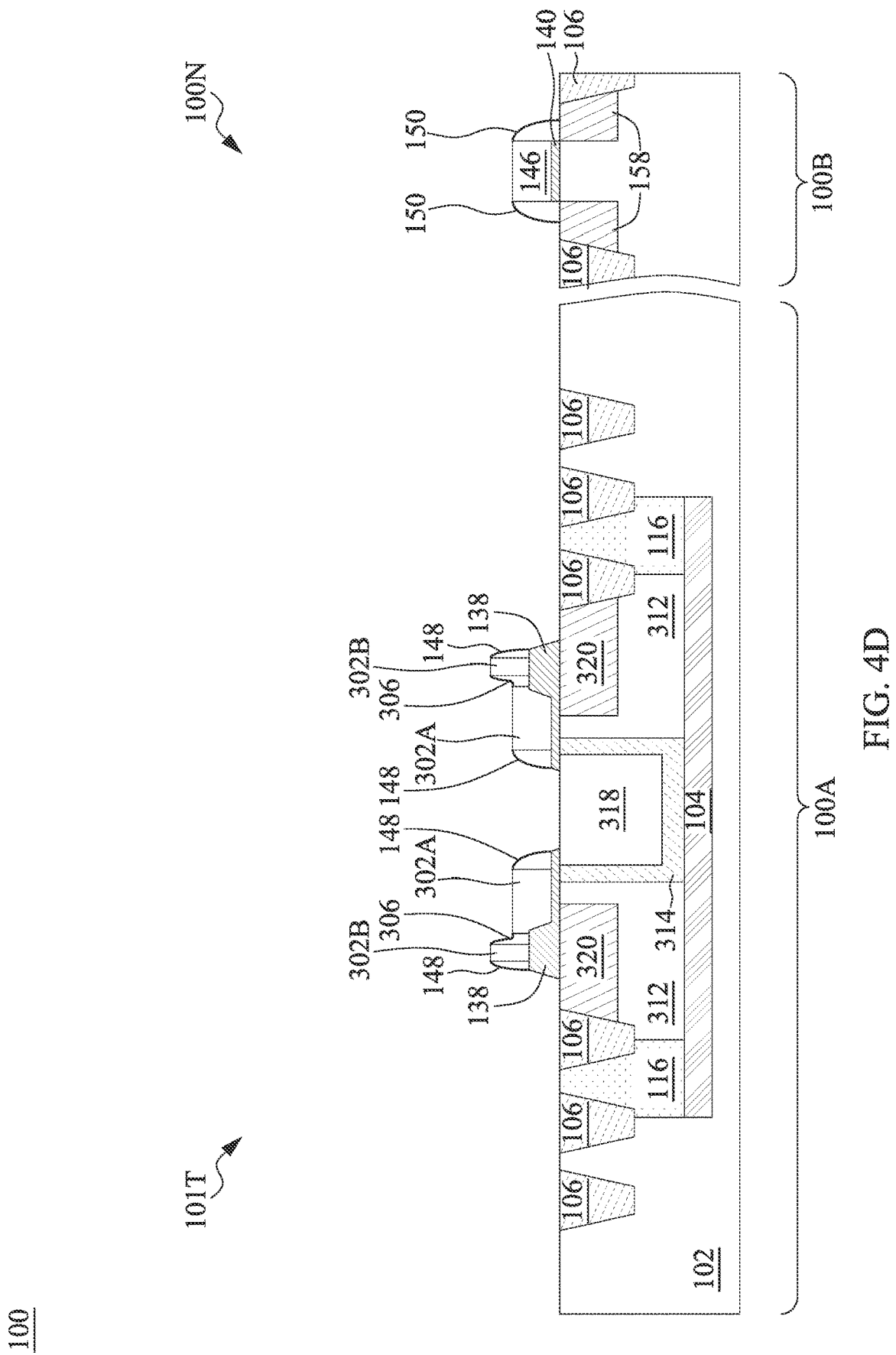

Referring to FIG. 4D, gate spacers 148 and 150 are formed on the sidewalls of the gate electrodes 302 and 146, respectively. In addition, gate spacers 306 are formed in spaces between the first region 302A and the second region 302B of each of the gate electrodes 302. In some embodiments, the gate spacers 148, 150 and 306 are formed in the same step. The materials, configurations and forming method of the gate spacers 306 are similar to those of forming the gate spacers 148 and 150.

Figure 4E:
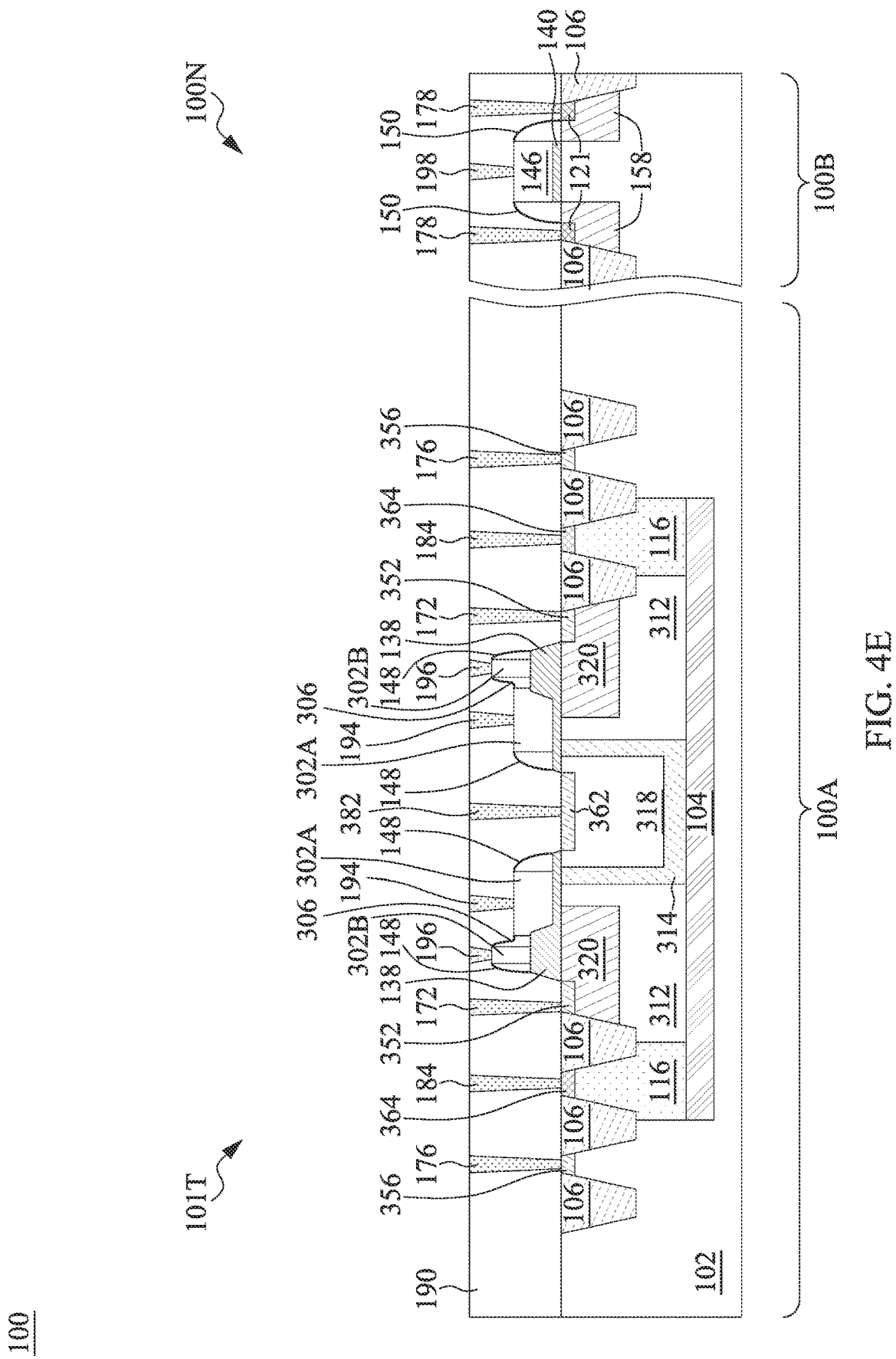

Referring to FIG. 4E, doped regions 352, 356 and 362 are formed in the substrate 102 with a conductivity type of P-type. Likewise, doped regions 158 and 364 are formed in the substrate 102 with a conductivity type of N-type. The ILD layer 190 is deposited over the substrate 102 and the gate electrodes 302 and 146.

In some embodiments, conductive vias 172, 176, 184 and 382 are formed through the ILD layer 190 to electrically connect to the doped regions 352, 356, 364 and 362, respectively. In addition, doped regions 158 are formed in NHV zone 100B of the substrate 102, and the conductive vias 178 are formed thorough the ILD layer 190 to electrically connect to the doped regions 158. Conductive vias 194 and 196 are formed in the ILD layer 190 to electrically connect to the first region 302A and second regions 302B, respectively, of the gate electrode 302. Further, the conductive via 198 is formed through the ILD layer 190 to electrically connect to the gate electrode 146.

Figure 5:
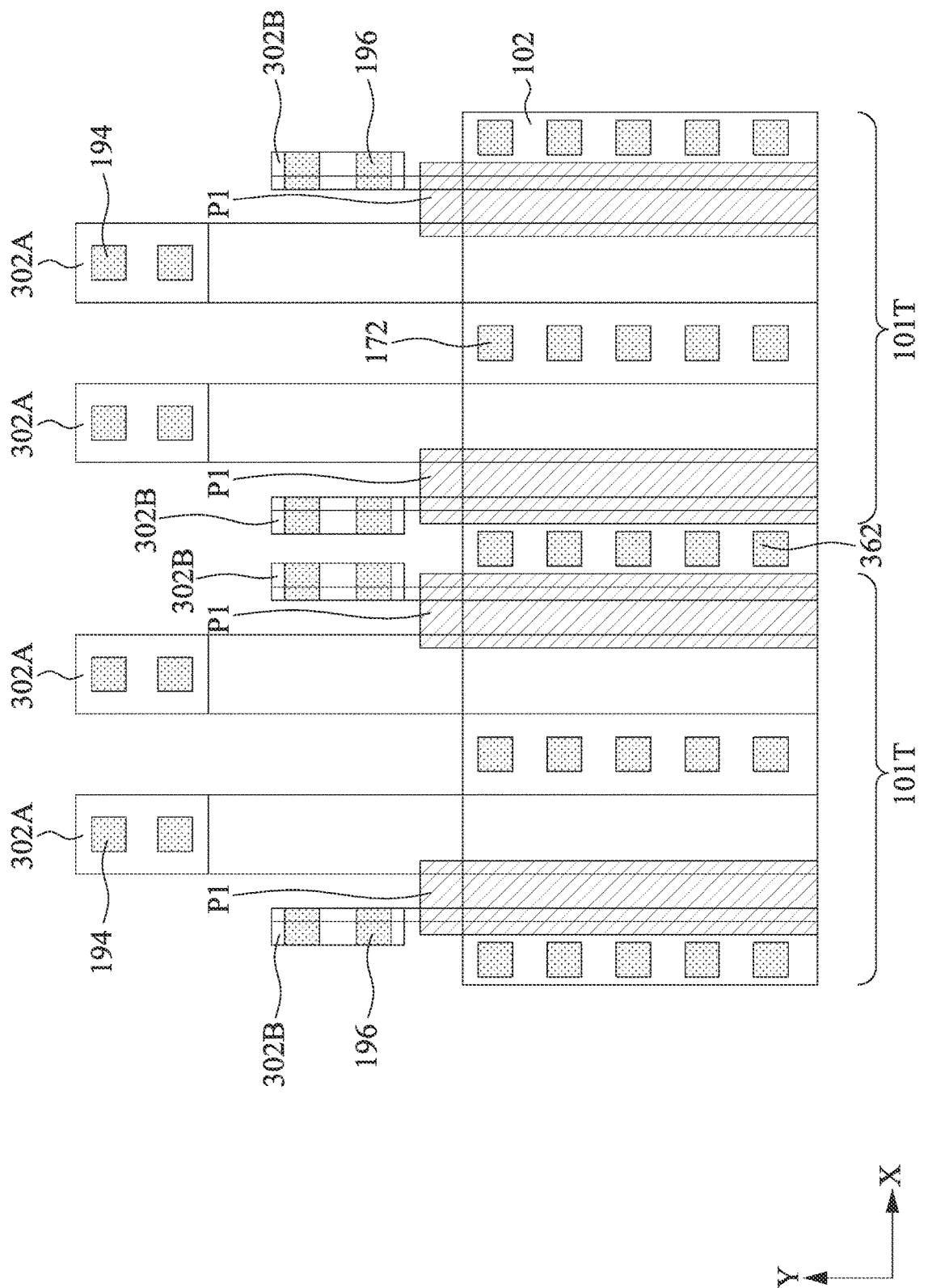
FIG. 5 shows a design layout of semiconductor devices, in accordance with some embodiments of the present disclosure.

FIG. 5 shows a design layout of the HV transistor 101T, in accordance with some embodiments of the present disclosure. The design layout shown in FIG. 5 only illustrates the gate electrodes 302, the first portions P1 of the gate dielectric layers 138, the substrate 102, and the conductive vias 172 and 362. Other features are omitted from the design layout of FIG. 5 for clarity. Further, a plurality of conductive vias 194 are shown to electrically connect to the first regions 302A, while a plurality of conductive vias 196 are shown to electrically connect to the second regions 302B. In some embodiments, although not explicitly shown, the conductive vias 194 are electrically connected to the conductive vias 382 so that the source terminal of the HV transistor 101T is electrically connected to the second region 302B of the gate electrode 302. As a result, the coupling capacitance between the gate terminal (first region 302A) and the drain terminal (doped regions 320) can be further decreased. In some embodiments, the gate electrodes 302 and the first portions P1 extend in the Y-axis, in which the gate electrodes 302 have greater lengths than the gate dielectric layers 138. In some embodiments, the first regions 302A have greater lengths than the second regions 302B.

According to an embodiment, a method includes: forming a barrier layer in a substrate; depositing a first dielectric layer over the substrate; forming a patterned mask layer over the first dielectric layer; patterning the first dielectric layer into a first sublayer of a gate dielectric layer; converting at least part of the patterned mask layer into a second sublayer of the gate dielectric layer; depositing a second dielectric layer adjacent to the first and second sublayers to serve as a third sublayer of the gate dielectric layer; and depositing a gate electrode over the gate dielectric layer.

According to an embodiment, a method includes: depositing a first dielectric layer formed of a first dielectric material over a substrate; forming a mask layer over the first dielectric layer; patterning the first dielectric layer into a first gate dielectric layer of a transistor using the mask layer as a patterning mask; converting at least part of the mask layer into a second gate dielectric layer of the transistor, wherein the second gate dielectric layer is formed of the first dielectric material; depositing a third gate dielectric layer of the transistor adjacent to the second gate dielectric layer; and depositing a gate electrode over the third gate dielectric layer.

According to an embodiment, a semiconductor structure includes: a barrier layer in a substrate; a gate dielectric layer over the substrate, the gate dielectric layer including a first portion and a second portion, the first portion thicker than the second portion, wherein the first portion includes a first material and a second material wrapped around by the first material; a gate electrode over the gate dielectric layer; and a gate spacer on two sides of the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a barrier layer in a substrate;
    depositing a first dielectric layer over the substrate;
    forming a patterned mask layer over the first dielectric layer;
    patterning the first dielectric layer into a first sublayer of a gate dielectric layer;
    converting at least part of the patterned mask layer into a second sublayer of the gate dielectric layer;
    depositing a second dielectric layer adjacent to the first and second sublayers to serve as a third sublayer of the gate dielectric layer; and
    depositing a gate electrode over the gate dielectric layer.

2. The method according to claim 1, further comprising forming a gate spacer laterally surrounding the gate electrode.

3. The method according to claim 1, wherein the gate electrode comprises a first portion over the first sublayer and a second portion over the third sublayer, wherein the first portion is higher than the second portion.

4. The method according to claim 1, wherein the third sublayer extends over the second sublayer.

5. The method according to claim 1, wherein the gate dielectric layer comprises a first portion including the first sublayer and the second sublayer, and a second portion including the third sublayer, wherein the first portion has a first thickness, the second portion has a second thickness, and a thickness ratio between the first thickness and the second thickness is between about 1.5 and about 3.

6. The method according to claim 1, wherein the first sublayer and the third sublayer are formed of a same material.

7. The method according to claim 6, wherein the same material is silicon oxide.

8. The method according to claim 1, wherein at least a portion of the patterned mask layer is kept unchanged during the converting of the patterned mask layer.

9. The method according to claim 8, wherein the portion of the patterned mask layer is covered by the second sublayer.

10. The method according to claim 1, wherein the patterned mask layer includes a nitrogen-containing dielectric material.

11. A method, comprising:
depositing a first dielectric layer formed of a first dielectric material over a substrate;
forming a mask layer over the first dielectric layer;
patterning the first dielectric layer into a first gate dielectric layer of a transistor using the mask layer as a patterning mask;
converting at least part of the mask layer into a second gate dielectric layer of the transistor, wherein the second gate dielectric layer is formed of the first dielectric material;
depositing a third gate dielectric layer of the transistor adjacent to the second gate dielectric layer; and
depositing a gate electrode over the third gate dielectric layer.

12. The method according to claim 11, wherein the converting of the at least part of the mask layer comprises annealing the substrate.

13. The method according to claim 11, wherein the converting of the at least part of the mask layer comprises converting silicon nitride on a surface of the mask layer into silicon oxide.

14. The method according to claim 11, wherein, prior to the depositing of the gate electrode, further comprising performing a cleaning operation using chemicals free of phosphoric acid.

15. The method according to claim 11, further comprising forming a first source/drain region and a second source/drain region in the substrate on two sides of the gate electrode, wherein the second gate dielectric layer is higher than the third gate dielectric layer and is closer to the first source/drain region than to the second source/drain region.

16. The method according to claim 11, wherein after the depositing of the second gate dielectric layer, the first gate dielectric layer has a first depth extending into the substrate, and the third gate dielectric layer has a second depth, greater than the first depth, extending into the substrate.

17. The method according to claim 11, further comprising forming a barrier layer and a doped region in the substrate prior to the depositing of the first dielectric layer, wherein the barrier layer and the doped region are connected to form a guard ring for the transistor.

18. A method, comprising:
depositing a first dielectric layer formed of a first dielectric material over a substrate;
forming a second dielectric layer different from the first dielectric layer over the first dielectric layer;
patterning the first dielectric layer into a first gate dielectric layer of a transistor using the second dielectric layer as a patterning mask;
depositing a third dielectric layer over the second dielectric layer and over the substrate to form a third gate dielectric layer of the transistor, wherein the depositing of the third dielectric layer reducing a nitrogen concentration in a first portion of the second dielectric layer, and a second portion of the second dielectric layer becomes a second gate dielectric layer of the transistor; and
depositing a gate electrode over the third gate dielectric layer.

19. The method of claim 18, wherein the first portion of the second dielectric layer is wrapped around by the first dielectric layer, the second portion of the second dielectric layer and the third dielectric layer.

20. The method of claim 19, wherein the depositing of the third gate dielectric layer comprising covering sidewalls of the first dielectric layer and the second dielectric layer in a conformal manner.

* * * * *